(12) United States Patent
Chang et al.

(10) Patent No.: US 11,552,128 B2
(45) Date of Patent: Jan. 10, 2023

(54) MEMORY DEVICE, MEMORY ARRAY AND METHOD OF FORMING THE SAME

(71) Applicant: GLOBALFOUNDRIES Singapore Pte. Ltd., Singapore (SG)

(72) Inventors: Wei Chang, Singapore (SG); Eng Huat Toh, Singapore (SG); Juan Boon Tan, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 292 days.

(21) Appl. No.: 16/994,746

(22) Filed: Aug. 17, 2020

(65) Prior Publication Data

US 2022/0052112 A1 Feb. 17, 2022

(51) Int. Cl.
*H01L 27/24* (2006.01)
*H01L 45/00* (2006.01)

(52) U.S. Cl.
CPC ...... *H01L 27/2409* (2013.01); *H01L 27/2463* (2013.01); *H01L 45/16* (2013.01)

(58) Field of Classification Search
CPC .. H01L 27/2409; H01L 27/2463; H01L 45/16
See application file for complete search history.

(56) References Cited

PUBLICATIONS

Aluguri et al., Overview of Selector Devices for 3-D Stackable Cross Point RRAM Arrays, Journal of the Electron Devices Society, Sep. 2016, pp. 294-306, vol. 4, No. 5, IEEE.
Luo et al., Fully BEOL Compatible TaOx-based Selector with High Uniformity and Robust Performance, IEEE International Electron Devices Meeting (IEDM), Dec. 2016, 4 pages, IEEE.
Liu et at., A 130.7mm2 2-Layer 32Gb ReRAM Memory Device in 24nm Technology, 2013 IEEE International Solid-State Circuits Conference, Feb. 2013, 3 pages, IEEE.
Kim et al., NbO2-based Low Power and Cost Effective 1S1R Switching for High Density Cross Point ReRAM Application; Symposium on VLSI Technology Digest of Technical Papers, 2014, 2 pages, IEEE.
Lee et al., Bipolar Resistive Switching Characteristics in Flexible Pt/MZT/Al Memory and Ni/NbO2/Ni Selector Structure, Journal of the Electron Devices Society, 2018, pp. 518-524, vol. 6, IEEE.
Kim et al., Advanced process technologies of 1S1R for High Density Cross Point ReRAM, 2015 Silicon Nanoelectronics Workshop (SNW), Jun. 2015, 2 pages, IEEE.

*Primary Examiner* — Marvin Payen
(74) *Attorney, Agent, or Firm* — Viering Jentschura & Partner MBB

(57) ABSTRACT

A memory device may be provided. The memory device may include a substrate, wherein the substrate includes a well having a first conductivity type. The memory device may further include a contact element arranged in the well and including a first contact having the first conductivity type; a diode layer arranged in the well and having a second conductivity type opposite to the first conductivity type; and a dummy gate configured to isolate the first contact from the diode layer. The memory device may further include a memory element electrically connected to the diode layer.

20 Claims, 17 Drawing Sheets

MEMORY DEVICE, MEMORY ARRAY AND METHOD OF FORMING THE SAME

TECHNICAL FIELD

The present disclosure relates generally to a memory device, a memory array, a method of forming a memory device, and a method of forming a memory array.

BACKGROUND

Semiconductor memories have numerous applications, including various consumer electronics and computing devices. Emerging memories include resistive random access memory (ReRAM), phase change random access memory (PCRAM), etc.

For high density application, memories may be integrated in cross-point or cross-bar memory architecture. In 1T1R (one-transistor and one-resistor) structure, bit cells have large cell size and incur large area penalty. Accordingly, cross-point memory architecture with 1S1R (one-selector and one-resistor) structure is proposed to achieve a compact cell size and to suppress sneak path current.

However, various selectors, such as BEOL (back end of line) metal base selectors, used in the conventional 1S1R structure are not compatible with complementary metal-oxide-semiconductor (CMOS) processes. These selectors may also suffer from low drivability, small on/off ratio, and poor endurance, and require low processing temperature.

SUMMARY

According to various non-limiting embodiments, there may be provided a memory device. The memory device may include a substrate, wherein the substrate includes a well having a first conductivity type. The memory device may further include a contact element arranged in the well and including a first contact having the first conductivity type; a diode layer arranged in the well and having a second conductivity type opposite to the first conductivity type; and a dummy gate configured to isolate the first contact from the diode layer. The memory device may further include a memory element electrically connected to the diode layer.

According to various non-limiting embodiments, there may be provided a method of forming a memory device. The method may include providing a substrate, wherein the substrate includes a well having a first conductivity type. The method may further include forming a contact element in the well, wherein the contact element includes a first contact having the first conductivity type; forming a diode layer in the well, wherein the diode layer has a second conductivity type opposite to the first conductivity type; forming a dummy gate to isolate the first contact from the diode layer; and electrically connecting a memory element to the diode layer.

According to various non-limiting embodiments, there may be provided a memory array. The memory array may include a substrate, wherein the substrate includes a well having a first conductivity type. The memory array may further include a plurality of columns including a plurality of memory cells arranged in a matrix form. The plurality of columns may include a first column of memory cells and a second column of memory cells. Each memory cell may include a diode layer arranged in the well and having a second conductivity type opposite to the first conductivity type; and a memory element electrically connected to the diode layer. The memory array may further include a contact element column including contact elements arranged in the well, wherein each contact element includes a first contact having the first conductivity type; a dummy gate configured to isolate the contact element column from the diode layer of each memory cell in the first column of memory cells; and a further dummy gate configured to isolate the diodes layers in the first column of memory cells from the diode layers in the second column of memory cells.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1:
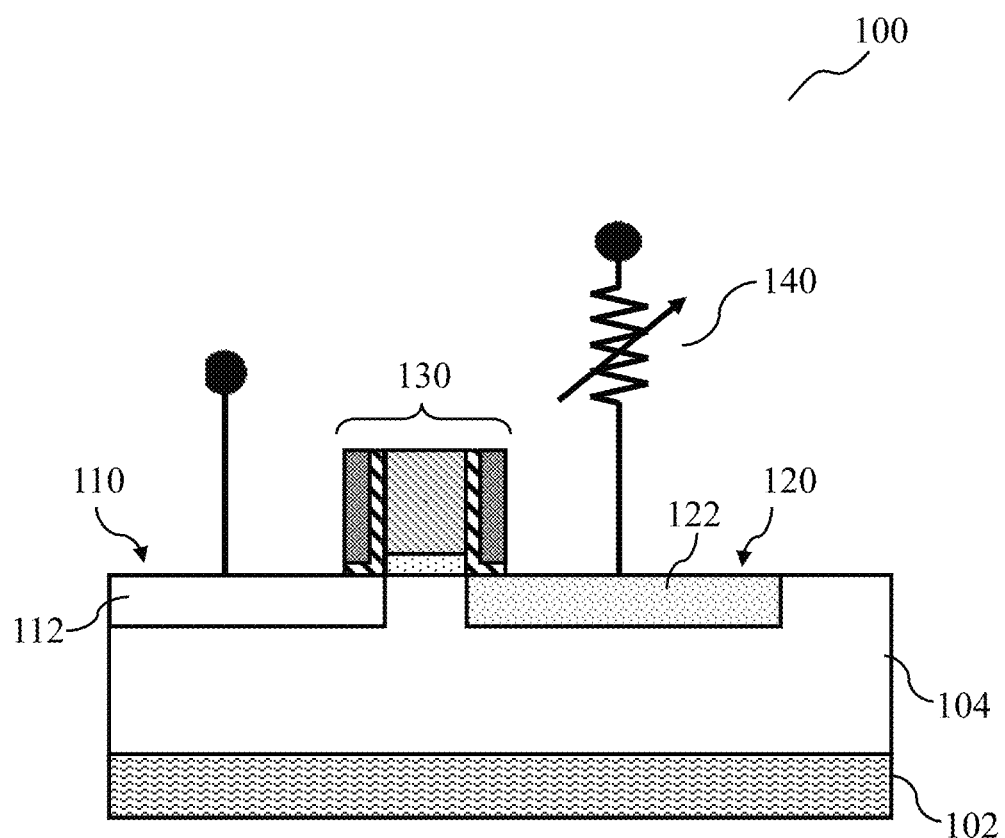
FIG. 1 shows a schematic diagram illustrating a cross-sectional view of a memory device according to various non-limiting embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

The term "connected" (or "coupled") herein, when used to refer to two physical elements, means a direct connection between the two physical elements or a connection through one or more intermediary elements.

It should be understood that the terms "on", "over", "under", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The non-limiting embodiments described below in context of the devices are analogously valid for the respective methods, and vice versa. Furthermore, it will be understood that the embodiments described below may be combined; for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

Various non-limiting embodiments relate to a memory device, for example, a resistive memory device. Various non-limiting embodiments further relate to a memory array, for example, a cross-point or cross-bar memory array with 1S1R (one-selector and one-resistor) structure or 2S1R (two-selector and one-resistor) structure.

FIG. 1 shows a schematic diagram illustrating a cross-sectional view of a memory device 100 according to various non-limiting embodiments.

As shown in FIG. 1, the memory device 100 may include a substrate 102. The substrate 102 may include a well 104 having a first conductivity type. The memory device 100 may further include a contact element 110 arranged in the well 104, wherein the contact element 110 may include a first contact 112 having the first conductivity type. A diode layer 122 may be arranged in the well 104, and may have a second conductivity type opposite to the first conductivity type. A dummy gate 130 may be configured to isolate the first contact 112 from the diode layer 122. The memory device 100 may further include a memory element 140 electrically connected to the diode layer 122.

In the memory device 100, the contact element 110 and the diode layer 122 may be arranged or formed in the substrate 102 in a FEOL (front end of line) process. For example, the first contact 112 of the contact element 110 and the diode layer 122 may be formed as a source or drain region of a transistor. The dummy gate 130 may be formed as a gate region of the transistor, though the dummy gate 130 is not functioning as a gate terminal of the transistor but to separate the diode layer 122 from the contact element 110. "Separate" as used herein means to isolate the mentioned components. Accordingly, a simple and compact diode formed by the diode layer 122 and compatible with complementary metal-oxide-semiconductor (CMOS) processes may be configured as a selector for operation of the memory element 140. Further, the dummy gate 130 may provide a compact isolation structure, which has a smaller size compared to a conventional isolation structure, such as STI (shallow trench isolation). In a non-limiting example, the dummy gate length may be in a range from about 10 nm to 40 nm, which is smaller than the length of the STI which may be in a range from about 40 nm to about 80 nm.

In some non-limiting embodiments, the first conductivity type may be N type and the second conductivity type may be P type. In other words, the well 104 may include N type dopants, and may be referred to as a N-well. The first contact 112 may include N type dopants, and may be referred to as a n+ contact. The diode layer 122 may include P type dopants, and may be referred to as a p+ diode layer. The doping concentration of the first contact 112 and the doping concentration of the diode layer 122 may be higher than the doping concentration of the well 104. In a non-limiting embodiment, the doping concentration of the well 104 may be in a range from about $1\times10^{16}$ cm$^{-3}$ to about $1\times10^{17}$ cm$^{-3}$. The doping concentration of the first contact 112 and the doping concentration of the diode layer 122 may be in a range from about $1\times10^{18}$ cm$^{-3}$ to about $1\times10^{20}$ cm$^{-3}$. It is to be noted that these ranges of the doping concentration for the well 104, the first contact 112 and the diode layer 122 are non-limiting examples only. It is understood that any suitable doping concentration for a well in semiconductor processes may be applied for the well 104, and any suitable doping concentration for source and drain regions in semiconductor processes may be applied for the first contact 112 and the diode layer 122. In alternative non-limiting embodiments, the first conductivity type may be P type and the second conductivity type may be N type. Accordingly, the well 104, the first contact 112 and the diode layer 122 may be a P-well 104, a p+ contact 112 and a n+ diode layer 122, respectively.

The substrate 102 may include a silicon substrate, a SOI (silicon-on-insulator) substrate, a germanium substrate, or any other suitable types of semiconductor substrates. Accordingly, the well 104, the first contact 112 and the diode layer 122 may be doped regions formed in the substrate 102.

According to various non-limiting embodiments, the diode layer 122 and at least a portion of the well 104, for example, a portion of the well 104 adjacent to the diode layer 122, may form a diode 120. Accordingly, the diode layer 122 and the portion of the well 104 having opposite conductivity type with each other may thus form a PN diode 120.

In an exemplary embodiment where the diode layer 122 is the p+ diode layer, the memory element 140 may be connected to the p+ diode layer, i.e. the anode of the PN diode 120, such that the diode 120 is configured to allow a current flow in a single direction from the memory element 140 to the diode 120. In alternative embodiments where the diode layer 122 is the n+ diode layer, the memory element 140 may be connected to the cathode of the PN diode 120, such that the diode 120 is configured to allow a current flow in a single direction from the diode 120 to the memory element 140. Accordingly, the diode 120 may be a selector configured for unipolar operation of the memory element 140, as will be illustrated in detail with reference to FIGS. 6 and 7 below.

Figure 2:
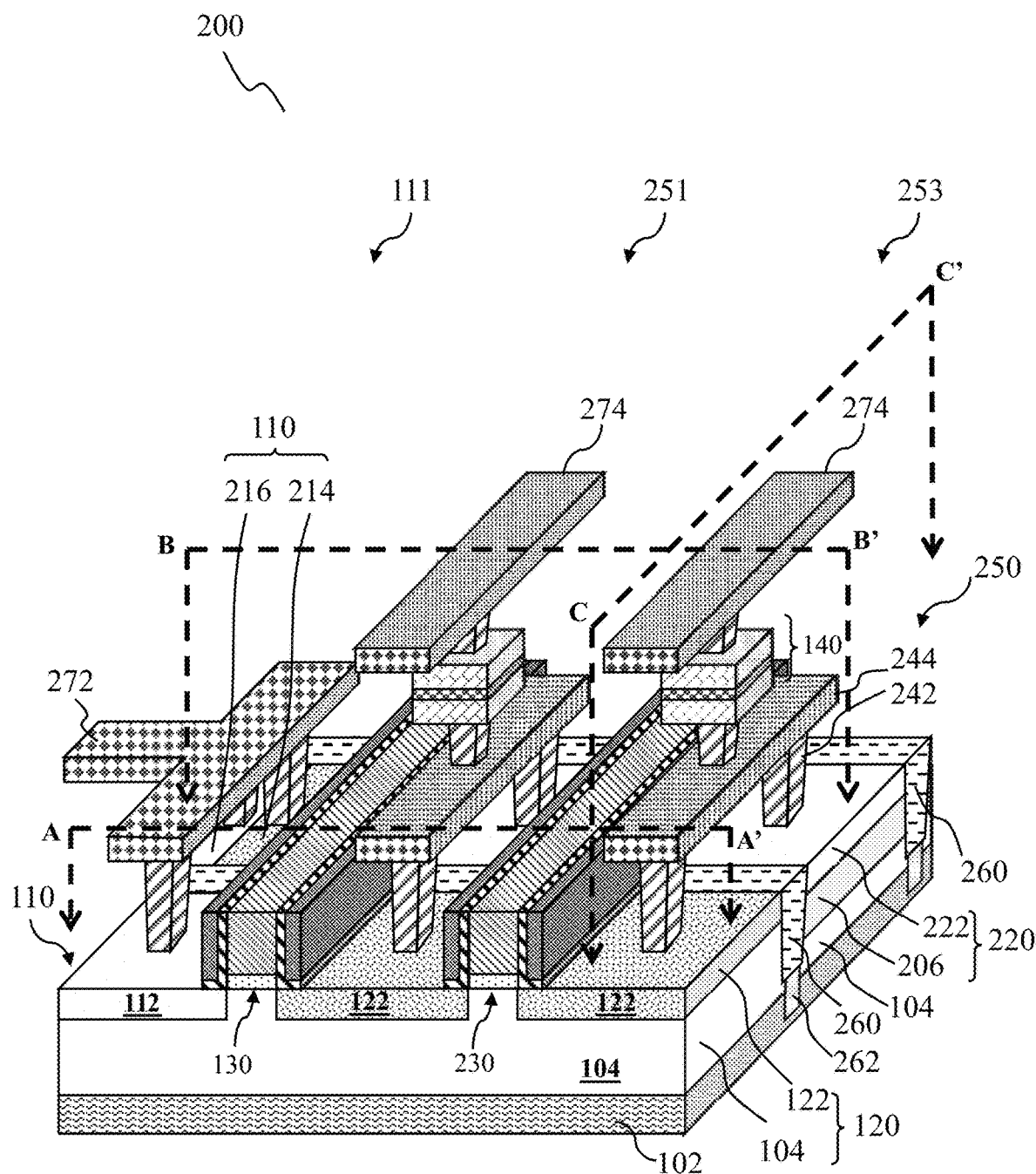
FIG. 2 shows a perspective view of a memory array according to various non-limiting embodiments.

According to various non-limiting embodiments, the memory device 100 may include a channel layer (as shown in FIG. 2 below) having the second conductivity type. The channel layer may be arranged in the well 104. The memory device 100 may include a further diode layer (as shown in FIG. 2) having the first conductivity type and electrically connected to the memory element 140, wherein the further diode layer and at least a portion of the channel layer may form a further diode. In other words, the memory element 140 may also be connected with the further diode layer having opposite conductivity type to the diode layer 122, such that the further diode may be configured to allow a current flow in a direction opposite to the direction allowed by the diode 120. Thus, the diode 120 and the further diode may be provided as two selectors configured for bipolar operation of the memory element 140, as will be illustrated in detail with reference to FIGS. 2, 3A-3C and 4 below.

In various non-limiting embodiments where the memory device 100 includes a further diode, the memory device may further include an isolation element (as shown in FIG. 2) arranged in the substrate 102 and an isolation well (as shown in FIG. 2) under the isolation element. The isolation element may be arranged between the diode layer 122 and the further diode layer, and the isolation well may have the second conductivity type.

In various non-limiting embodiments where the memory device 100 includes a further diode, the contact element 110 may further include a second contact (as shown in FIG. 2) arranged in the channel layer and a third contact (as shown in FIG. 2) arranged in the well 104. The second contact may have the second conductivity type, and the third contact may have the first conductivity type. The dummy gate 130 may be configured to isolate the second contact from the further diode layer.

The dummy gate 130 may include a gate dielectric layer, a gate layer arranged over the gate dielectric layer, and an insulating spacer surrounding the gate dielectric layer and the gate layer, as will be illustrated in detail in FIG. 3A below. The gate dielectric layer may include a dielectric material, such as an oxide material, e.g., silicon oxide. The gate layer may include poly-silicon, or metal, such as Al, TaN, or TiN. The insulating spacer may include an insulating material, e.g., silicon oxide, or silicon nitride, or a combination thereof.

The dummy gate 130 may be configured to separate or isolate the diode 120 from the contact element 110. In an exemplary non-limiting embodiment, no voltage is applied to the dummy gate 130 such that the dummy gate 130 is not functioning as a gate terminal of a transistor. The dummy gate 130 may be easily formed in the CMOS process without additional steps or processes, and at the same time provide a more compact structure compared to STI structure. In alternative non-limiting embodiments, the dummy gate 130 may be biased to reduce a sneak current. Illustratively, in a memory array including a plurality of the memory devices 100, the sneak current may flow through unselected memory devices through a selected wordline and a selected bitline. To reduce or eliminate the sneak current, the dummy gate 130 located along a current path of a selected memory device may be supplied with a half forward bias to assist formation of a channel under the dummy gate, while the dummy gate 130 not located along the current path of the selected memory device may be supplied with a half reverse bias to ensure that the channel is off under this dummy gate. Accordingly, current may only pass through the selected memory device to prevent the sneak current effect.

Figure 12A:
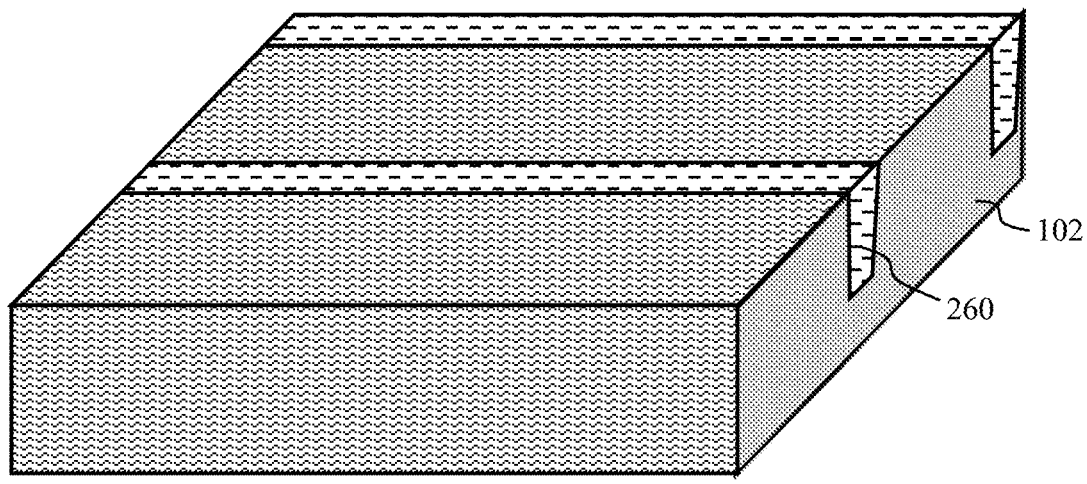
FIGS. 12A-12F illustrate a method of forming a memory array according to various non-limiting embodiments.
Figure 12B:
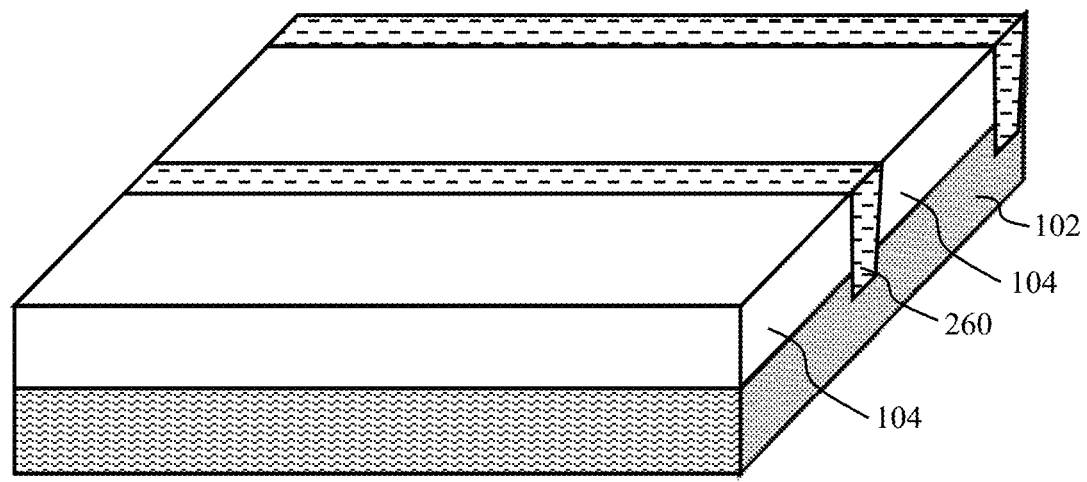
Figure 12C:
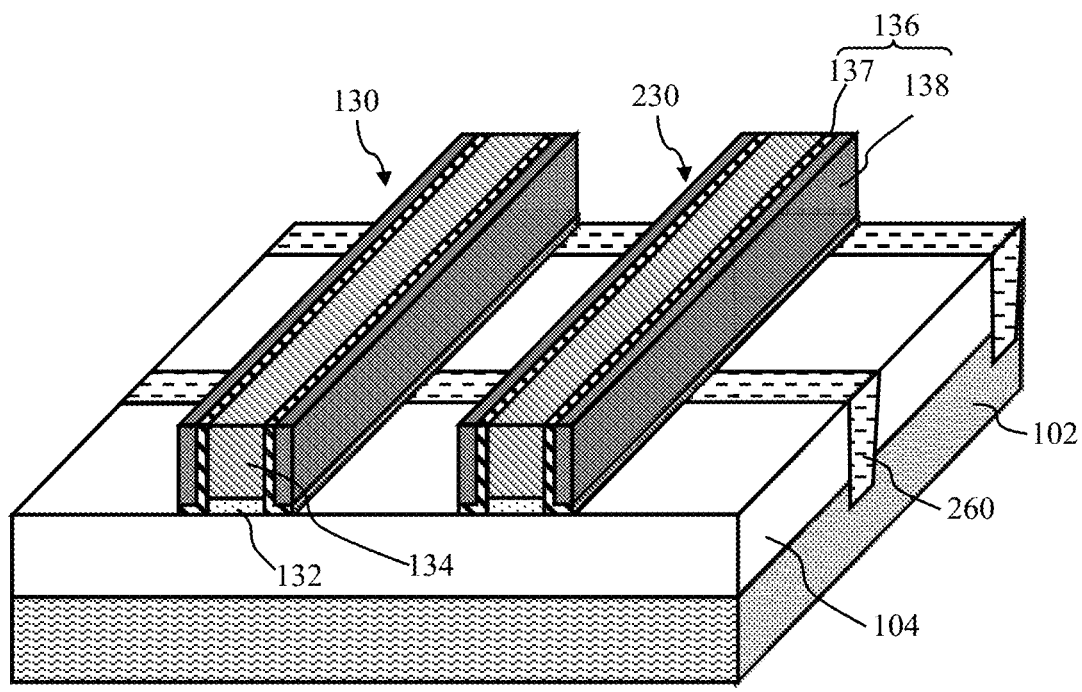
Figure 12D:
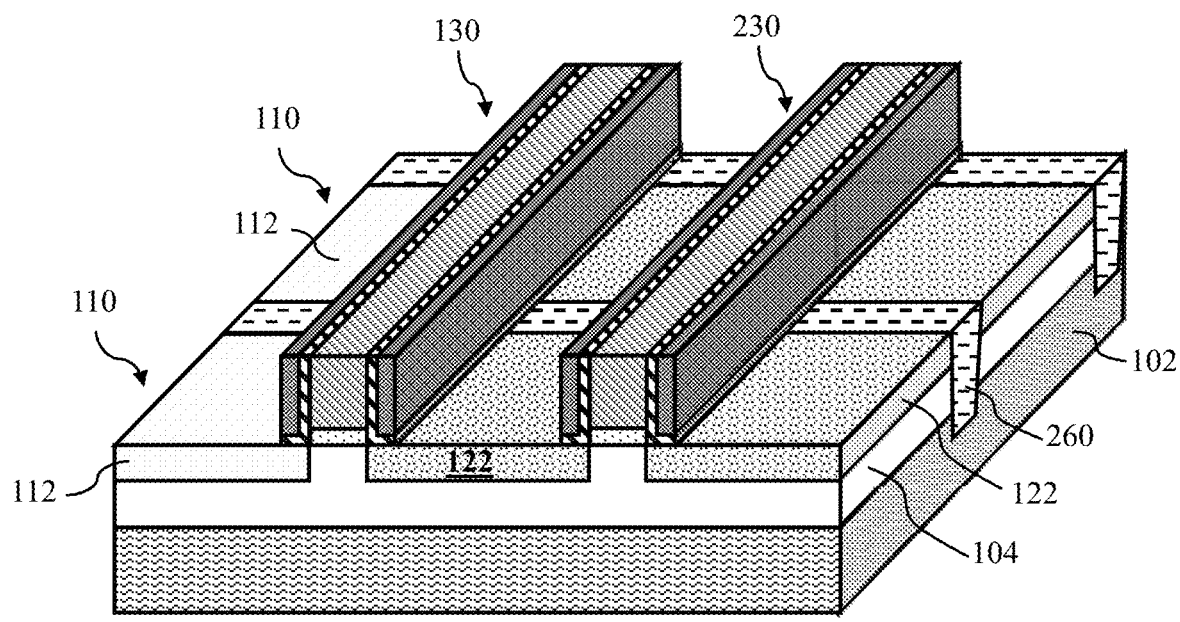
Figure 12E:
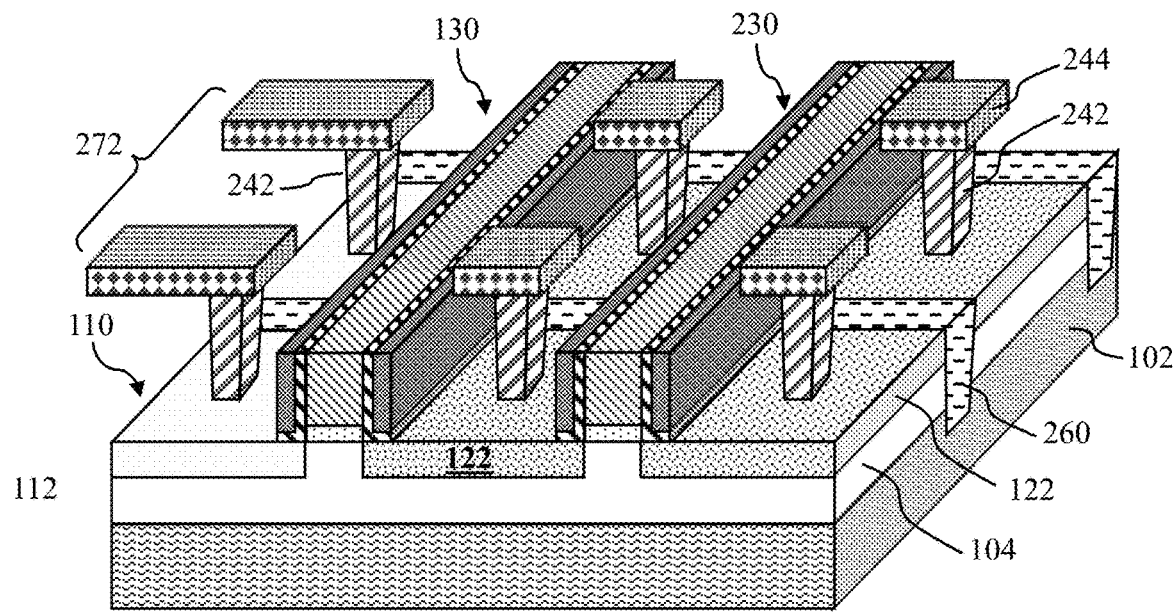
Figure 12F:
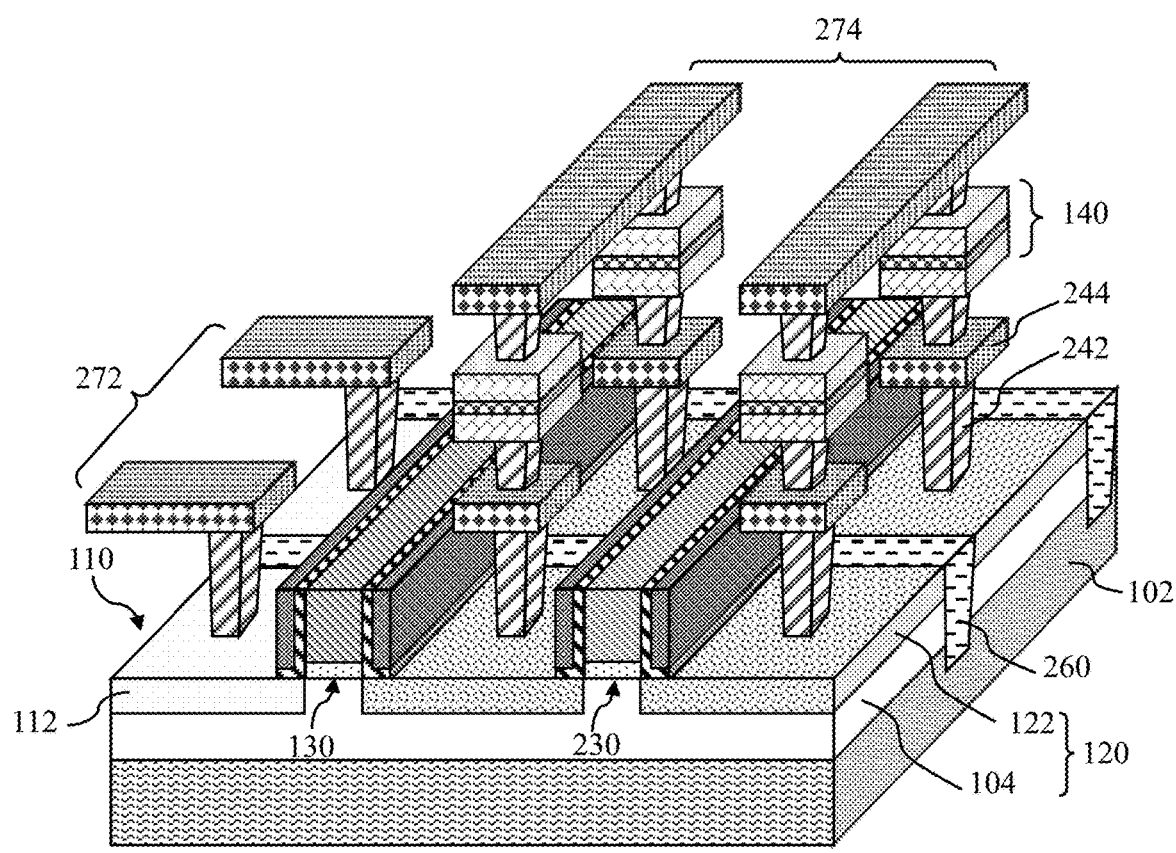

The contact element 110 may be electrically connected to a first signal line (as shown in FIG. 2 and FIG. 12F), e.g., a bitline (BL). The memory element 140 may be electrically connected to a second signal line (as shown in FIG. 2 and FIG. 12F), e.g., a wordline (WL). In alternative non-limiting embodiments, the first signal line may be a wordline, and the second signal line may be a bitline.

When a predetermined bias is applied to the bitline and the wordline, the well 104 may be configured to electrically connect the diode 120 to the first signal line through the contact element 110, and the well 104 may also function as part of the first signal line. Accordingly, the memory element 140 and the diode 120 may be electrically connected in series between the bitline and the wordline, such that the predetermined bias may be applied to the memory element 140 and the diode 120 through the bitline and the wordline for selection and operation of the memory element 140.

The memory element 140 may be a resistive memory, such as a resistive random access memory (ReRAM), or a phase change random access memory (PCRAM). The memory element 140 may include an oxide layer or a resistive dielectric layer between two electrodes.

The memory device 100 may be used as a unit cell or a bit cell of a memory array as described in various non-limiting embodiments below.

FIG. 2 shows a perspective view of a memory array 200 according to various non-limiting embodiments. FIG. 3A shows a cross-sectional view of the memory array 200 of FIG. 2 along line A-A' according to various non-limiting embodiments. FIG. 3B shows a cross-sectional view of the memory array 200 of FIG. 2 along line B-B' according to various non-limiting embodiments. FIG. 3C shows a cross-sectional view of the memory array 200 of FIG. 2 along line C-C' according to various non-limiting embodiments. The memory array 200 may include a plurality of memory devices similar to the memory device 100 of FIG. 1, and thus the common features are labeled with the same reference numerals. Various embodiments described with reference to FIG. 1 are analogously valid for the memory array 200 of FIGS. 2 and 3A-3C, and vice versa.

Similar to the memory device 100, the memory array 200 may include the substrate 102 having the well 104 of the first conductivity type. The memory array 200 may also include a plurality of columns including a plurality of memory cells 250 arranged in a matrix form, wherein the plurality of columns includes a first column 251 of memory cells and a second column 253 of memory cells. In other words, the plurality of memory cells 250 may be arranged at crosspoints of rows and columns of the matrix. The memory cells 250 may also be referred to as the unit cells or bit cells of the memory array 200.

Each memory cell 250 in the memory array 200 may include the diode layer 122 arranged in the well 104, wherein the diode layer 122 has the second conductivity type opposite to the first conductivity type. Each memory cell 250 may further include the memory element 140 electrically connected to the diode layer 122.

Each memory element 140 may be a resistive memory, such as a resistive random access memory (ReRAM), or a phase change random access memory (PCRAM). The memory element 140 may include an oxide layer or a resistive dielectric layer between two electrodes.

According to various non-limiting embodiments, a respective diode layer 122 and at least a portion of the well 104, for example, a portion of the well 104 adjacent to the respective diode layer 122, may form a diode 120 for each memory cell 250. Accordingly, the respective diode layer 122 and the respective portion of the well 104 having opposite conductivity type with each other may thus form a respective PN diode 120 for each memory cell 250.

In various non-limiting embodiments of FIG. 2, each memory cell 250 in the memory array 200 may further include a channel layer 206 having the second conductivity type. The channel layer 206 may be arranged in the well 104. Each memory cell 250 may further include a further diode layer 222 arranged in the channel layer 206, wherein the further diode layer 222 has the first conductivity type and is electrically connected to the respective memory element 140. As shown in FIG. 2, the memory element 140 may be electrically connected to the further diode layer 222 through the respective interconnect 242 and the metal layer 244.

The further diode layer 222 and at least a portion of the channel layer 206, for example, at least a portion of the channel layer 206 adjacent to the further diode layer 222, may form a further diode 220 for each memory cell 250. The further diode layer 222 and the portion of the channel layer 206 have opposite conductivity types and thus form a further PN diode 220.

In other words, each memory element 140 may be connected not only to the diode layer 122 of the respective diode 120, but also to the further diode layer 222 of the respective further diode 220 having opposite conductivity type from the diode layer 122, as shown in FIG. 3C. Accordingly, the further diode 220 may be configured to allow a current flow in a direction opposite to the direction allowed by the diode 120. Thus, the diode 120 and the further diode 220 may be provided as two selectors configured for bipolar operation of the memory element 140, as will be illustrated in detail with reference to FIG. 4 below.

In various non-limiting embodiments of FIG. 2, the well 104 may include portions at the region of the diode 120 and portions at the region of the further diode 220. In alternative non-limiting embodiments, the well 104 may include a deep well (e.g., as shown in FIG. 11B below) under the channel layer 206, wherein the deep well may have the same conductivity type with the well 104. In a non-limiting embodiment where the well 104 is a N-well, the deep well may be a deep N-well (DNW). In other words, the well 104 may include portions at the region where the diode 120 is to be formed and may include the deep well at the region where the further diode 220 is to be formed.

As shown in FIG. 2 and FIG. 3C, the memory array 200 may include a plurality of isolation elements 260 arranged in a column in the substrate 102 and a respective isolation well 262 under the respective isolation element 260. The respective isolation element 260 may be arranged between the respective diode layer 122 and the respective further diode layer 222 in each column of memory cells, so as to isolate the diode 120 from the further diode 220 in each memory cell 250 and to isolate the memory cells 250 within the same column of memory cells from each other. In other words, as illustrated in a non-limiting embodiment in FIG. 3C, a first memory cell 250a and a second memory cell 250b in the same column along line C-C' of FIG. 2 are shown, wherein the first memory cell 250a and the second memory cell 250b are neighbouring memory cells with the isolation element 260 arranged therebetween. The isolation element 260 may be configured to isolate the diode 120a, 120b from the further diode 220a, 220b in each memory cell 250a, 250b. The isolation element 260 may also be configured to isolate the diode 120b of the second memory cell 250b from the further diode 220a of the first memory cell 250a, as shown in FIG. 3C. The isolation well 262 may be arranged to separate and isolate the portion of the well layer 104 under the diode 120a, 120b from the portion of the well layer 104 under the further diode 220a, 220b. In other words, the isolation well 262 may be configured to isolate dual channels provided within each memory cell 250a, 250b, wherein the dual channels include a first channel formed in the portion of the well layer 104 under the diode 120a, 120b and a second channel formed in the portion of the well layer 104 under the further diode 220a, 220b.

The isolation element 260 may include a STI (shallow trench isolation) extending into the substrate 102. The isolation wells 262 may extend further into the substrate 102 from the bottom of the isolation elements 260. The isolation wells 262 may have the second conductivity type. In a non-limiting embodiment where the well 104 is N-well, the isolation wells 262 may be P-well which, along with the isolation element 260, may be configured to isolate the diode 120 from the neighbouring further diode 220 arranged in the well 104.

The memory array 200 may include a contact element column 111 including contact elements 110 arranged in the well 104, wherein each contact element 110 may include the first contact 112 having the first conductivity type. In a non-limiting embodiment shown in FIG. 2, the contact element column 111 may be arranged next to or parallel to the first column 251 of memory cells 250. Each contact element 110 may be arranged next to a respective memory cell in the first column 251 of memory cells 250, as shown in FIG. 2 and FIG. 3A.

The contact element column 111 may further include a plurality of second contacts 214 arranged in the channel layers 206 where the plurality of second contacts 214 have the second conductivity type, and a plurality of third contacts 216 arranged in the well 104 where the plurality of third contacts 216 have the first conductivity type. In the non-limiting embodiments as shown in FIG. 2 and FIG. 3B, each contact element 110 may further include a second contact 214 arranged in the channel layer 206 and a third contact 216 arranged in the well 104.

In various non-limiting embodiments, the memory device 100 as described with reference to FIG. 1 above may include the structure of the further diode 220, the second contact 214 and the third contact 216 as illustrated in FIG. 3B, in place of or in addition to the structure of the diode 120 and the first contact 112 as illustrated in FIG. 1.

In the memory array 200, the column 111 of contact elements 110 may be arranged next to or parallel to the first column 251 of memory cells 250, and each contact element 110 may be arranged next to a memory cell 250 in the first column 251 of memory cells. As FIG. 2 only shows one memory cell 250 in each column 251, 253 of memory cells for simplicity, only one contact element 110 including the first contact 112, the second contact 214 and the third contact 216 is shown in FIG. 2. It is understood that in various non-limiting embodiments where the memory array 200 includes multiple memory cells 250 in the column 251, 253 of memory cells, multiple contact elements 110 may be arranged in a column to form the contact element column 111 wherein each contact element 110 is arranged next to a respective memory cell 250 in the first column 251 of memory cells.

In various non-limiting embodiments, the doping concentrations of the second contact 214, the third contact 216 and the further diode layer 222 may be higher than the doping concentrations of the channel layer 206 and the well 104. In a non-limiting embodiment, the doping concentrations of the channel layer 206 and the well 104 may be in a range from about $1 \times 10^{16}$ cm$^{-3}$ to about $1 \times 10^{17}$ cm$^{-3}$. The doping concentrations of the second contact 214, the third contact 216 and the further diode layer 222 may be in a range from about $1 \times 10^{18}$ cm$^{-3}$ to about $1 \times 10^{20}$ cm$^{-3}$. It is to be noted that these ranges of the doping concentration for the channel layer 206, the well 104, the second contact 214, the third contact 216 and the further diode layer 222 are non-limiting examples only. It is understood that any suitable doping concentration for a channel layer and a well in semiconductor processes may be applied for the channel layer 206 and the well 104, and any suitable doping concentration for source and drain regions in semiconductor processes may be applied for the second contact 214, the third contact 216 and the further diode layer 222.

In an illustrative non-limiting embodiment where the first conductivity type is N type, the well 104 may be N-well, and the channel layer 206 may be a P-channel. The first contact 112 may be a n+ contact, and the diode layer 122 may be a p+ diode layer. Similarly, the second contact 214 may be a p+ contact, the third contact 216 may be a n+ contact, and the further diode layer 222 may be a n+ diode layer.

As shown in FIG. 2, each contact element 110 may include the first contact 112 configured to electrically connect to the respective diode 120 through the well 104, and may include the second contact 214 configured to electrically connect to the respective further diode 220 through the channel layer 206. As shown in FIG. 3B, the second contact 214 may be electrically connected with the third contact 216. The second contact 214 and the third contact 216 may be further electrically connected with the first contact 112, as shown in FIG. 2. The three terminals 112, 214, 216 are configured at the same bias, which is to ensure that the well layer 104 under the channel layer 206 has the same bias with the well layer 104 under the first contact 112, so that a PN diode is not formed between the channel layer 206 and the well layer 104.

The isolation elements 260 may extend to the region of the well 104 where the contact elements 110 are arranged, so as to separate the first contact 112 from the second contact 214 and the third contact 216, as shown in FIG. 2.

The memory array 200 may include the dummy gate 130 configured to isolate the contact element column 111 from the diode layer 122 of each memory cell 250 in the first column 251 of memory cells. In various non-limiting embodiments, the dummy gate 130 may be arranged over a space between the first contacts 112 of the contact element column 111 and the diode layers 122 of the first column 251 of memory cells 250, to separate or isolate the column of first contacts 112 from the neighbouring column of diode layers 122. In the non-limiting embodiments shown in FIG. 2, the dummy gate 130 may also be arranged over a space between the second contacts 214 in the contact element column 111 and the further diode layers 222 in the first column 251 of memory cells 250. Accordingly, the dummy gate 130 may be configured to isolate the plurality of second contacts 214 in the contact element column 111 from the further diode layers 222 in the first column 251 of memory cells.

The memory array 200 may further include a further dummy gate 230 configured to isolate the diode layers 122 of the memory cells in the first column 251 of memory cells from the diode layers 122 of the memory cells in the second column 253 of memory cells. In various non-limiting embodiments, the further dummy gate 230 may be arranged over a respective space between the diode layers 122 in neighbouring columns 251, 253 of memory cells 250. The further dummy gate 230 may also be arranged over a respective space between the further diode layers 222 in neighbouring columns 251, 253 of memory cells 250. In other words, the further dummy gate 230 may be arranged to separate or isolate the neighbouring columns 251, 253 of memory cells 250. Although FIG. 2, FIG. 3A and FIG. 3B show only one further dummy gate 230 arranged between two columns 251, 253 of memory cells 250, it is understood that more than one further dummy gate 230 may be included when more than two columns of memory cells 250 are included in the memory array 200.

Figure 3A:
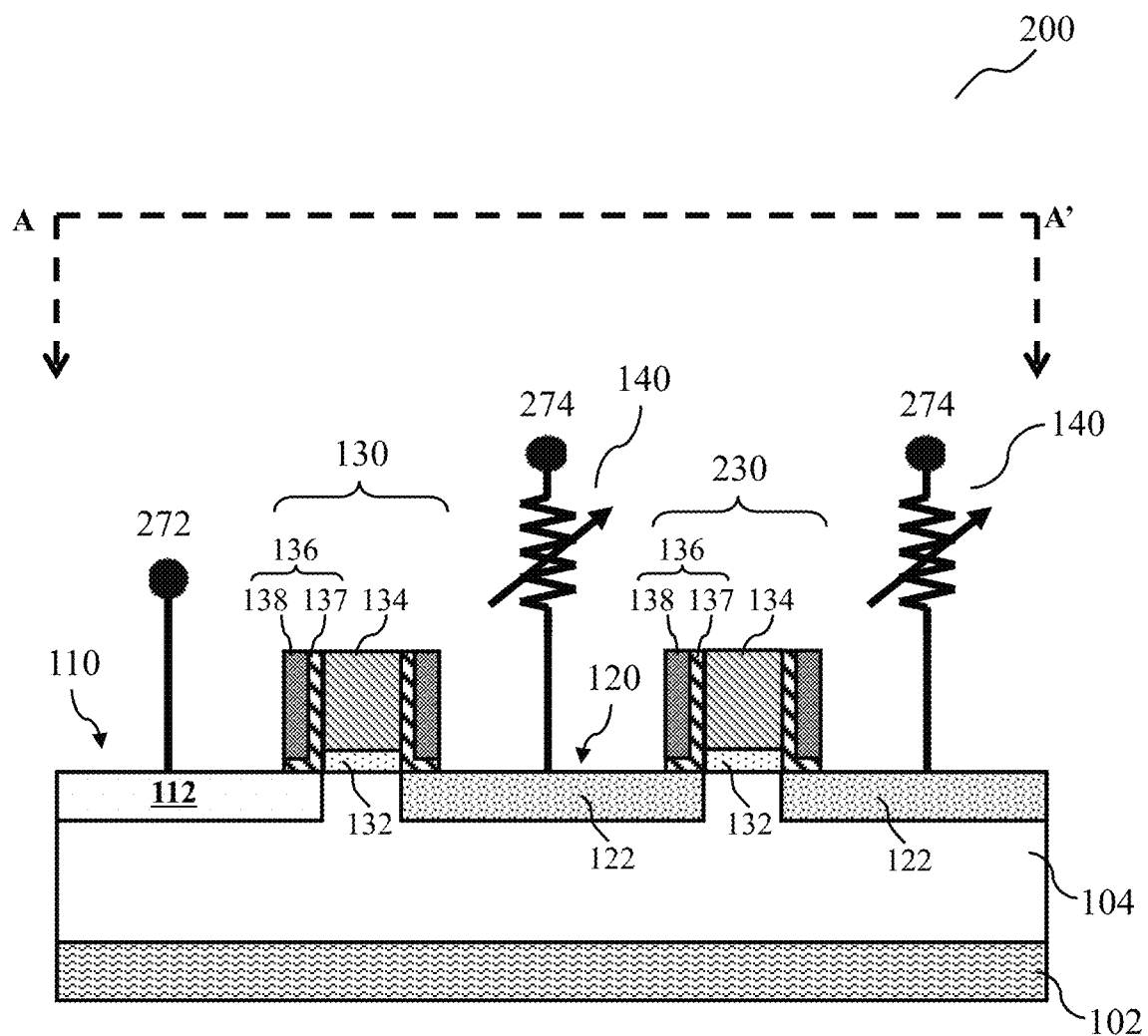
FIG. 3A shows a cross-sectional view of the memory array of FIG. 2 along line A-A' according to various non-limiting embodiments.
Figure 3B:
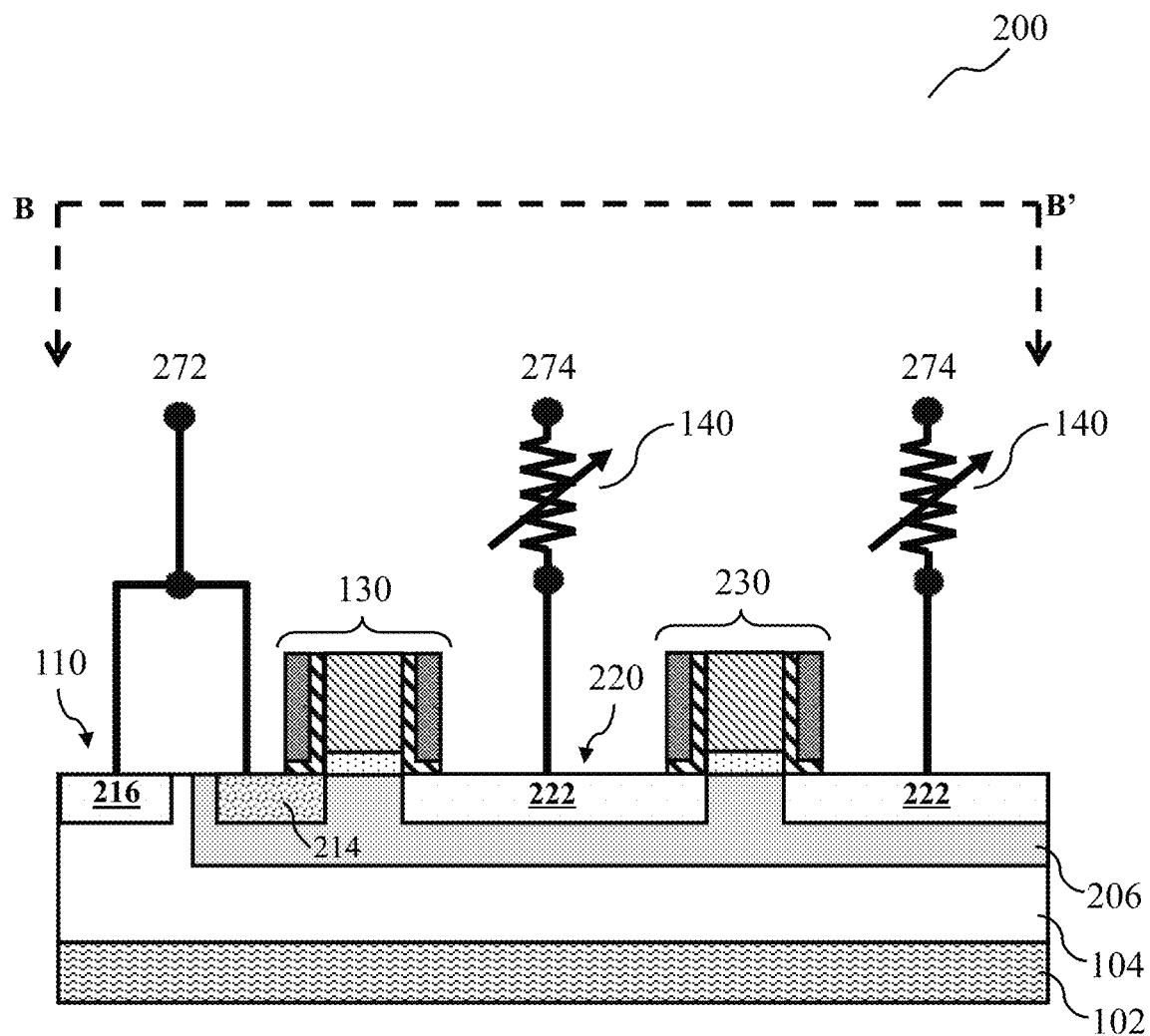
FIG. 3B shows a cross-sectional view of the memory array of FIG. 2 along line B-B' according to various non-limiting embodiments.
Figure 3C:
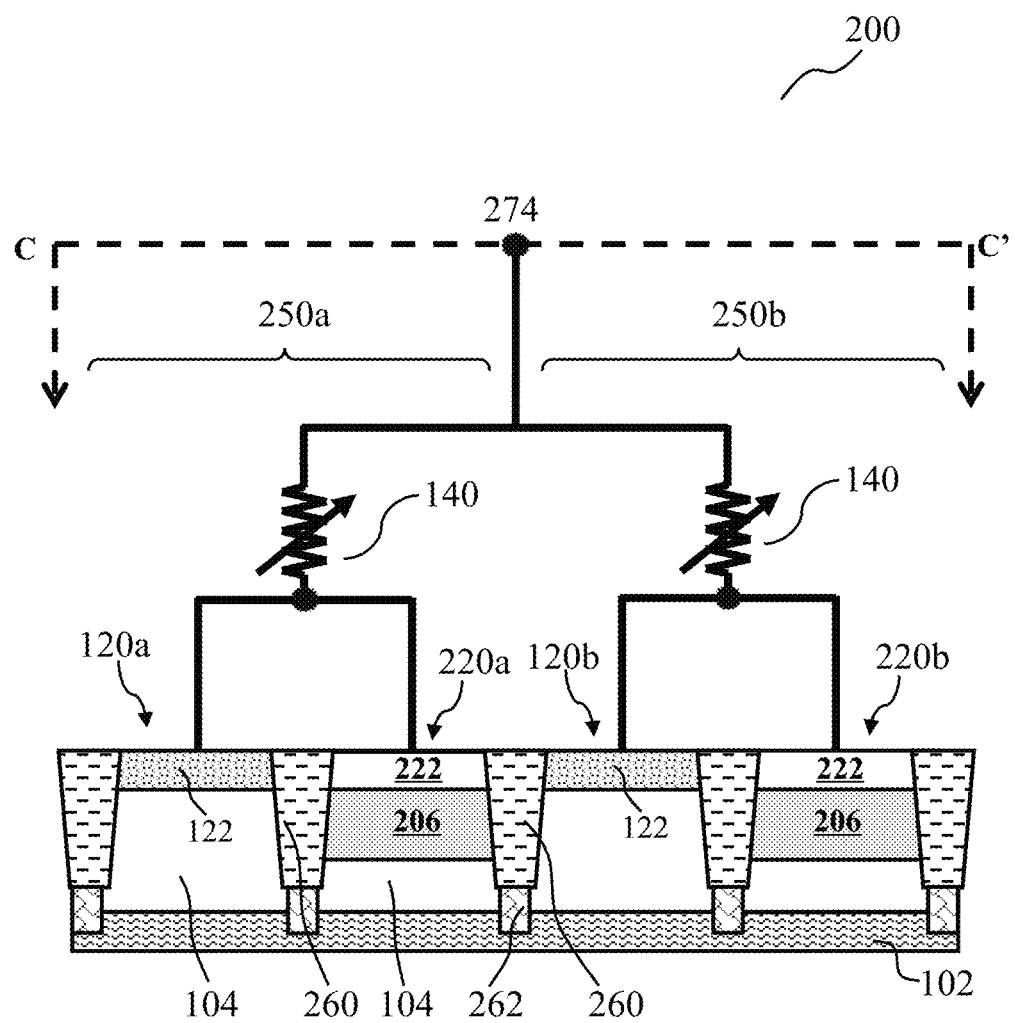
FIG. 3C shows a cross-sectional view of the memory array of FIG. 2 along line C-C' according to various non-limiting embodiments.

As illustrated in FIG. 3A, the dummy gate 130 and the further dummy gate 230 may each include a gate dielectric layer 132, a gate layer 134 arranged over the gate dielectric layer 132, and an insulating spacer 136 surrounding the gate dielectric layer 132 and the gate layer 134. The gate dielectric layer 132 may be arranged over the well 104, and may include a dielectric material, such as an oxide material, e.g., silicon oxide. The gate layer 134 may include poly-silicon, or metal, such as Al, TaN, or TiN. The insulating spacer 136 may be arranged over the first contacts 112 and the diode layers 122, and may include an insulating material, e.g., silicon oxide, silicon nitride, or a combination thereof. In a non-limiting embodiment, the insulating spacer 136 may include an inner spacer 137 and an outer spacer 138 at least partially surrounding the inner spacer 137. In a non-limiting example, the inner spacer 137 may include silicon oxide, and the outer spacer 138 may include silicon nitride.

The dummy gate 130 may be configured to separate or isolate the respective contact element 110 in the contact element column 111 from the respective diode 120 in the first column 251 of memory cells. The further dummy gate 230 may be configured to separate or isolate the diodes 120 in neighbouring columns 251, 253 of memory cells. Said differently, the further dummy gate 230 may isolate or separate a diode or diodes of a first column 251 of memory cells from a diode or diodes of a second column 253 of memory cells. In an exemplary non-limiting embodiment, no voltage is applied to the dummy gate 130 and the further dummy gate 230, such that the dummy gate 130 and the further dummy gate 230 are not functioning as the gate terminal of a transistor. The dummy gate 130 and the further dummy gate 230 may be easily formed in the CMOS process without additional steps or processes, and at the same time provide a more compact structure compared to STI structure. In alternative non-limiting embodiments, the dummy gate 130 and the further dummy gate 230 may be biased to reduce a sneak current which may flow through unselected memory cells 250 through a selected wordline and a selected bitline. To reduce or eliminate the sneak current, the dummy gate 130 and/or the further dummy gate 230 located along a current path of a selected memory cell 250 may be supplied with a half forward bias to assist formation of a channel under the corresponding dummy gate and/or the corresponding further dummy gate 230, while the further dummy gate 230 not located along the current path of the selected memory cell may be supplied with a half reverse bias to ensure that the channel is off under the corresponding further dummy gate. Accordingly, current may only pass through the selected memory cell to prevent the sneak current effect.

As shown in FIGS. 2 and 3A-3C, each contact element 110 may be electrically connected to a respective first signal line 272, e.g., a bitline (BL). Each column of memory elements 140 may be electrically connected to a respective second signal line 274, e.g., a wordline (WL). For simplicity, the first signal line may be a bitline and the second signal line may be a wordline in the following description. However, it is understood that in alternative non-limiting embodiments, the first signal line 274 may be a wordline, and the second signal line 276 may be a bitline.

As only one row of memory cells 250 is shown in FIG. 2, only one bitline 272 is shown for applying a voltage to the row of memory cells 250 through the contact element 110. It is understood that more than one bitlines 272 may be included in the memory array 200.

In the non-limiting embodiments shown in FIG. 3C, a column of memory cells 250 along line C-C' of FIG. 2 is shown, which includes two memory cells 250a, 250b. The memory cells 250a, 250b in the same column are connected to the same wordline 274, by electrically connecting one terminal of the respective memory element 140 to the wordline 274. The other terminal of the respective memory element 140 may be electrically connected to the respective diode layer 122 and the respective further diode layer 222 of the respective memory cell 250.

When a predetermined bias is applied to a selected bitline 272 and a selected wordline 274, the memory cell 250 connected between the selected bitline and the selected wordline may be selected and operated accordingly.

Figure 4:
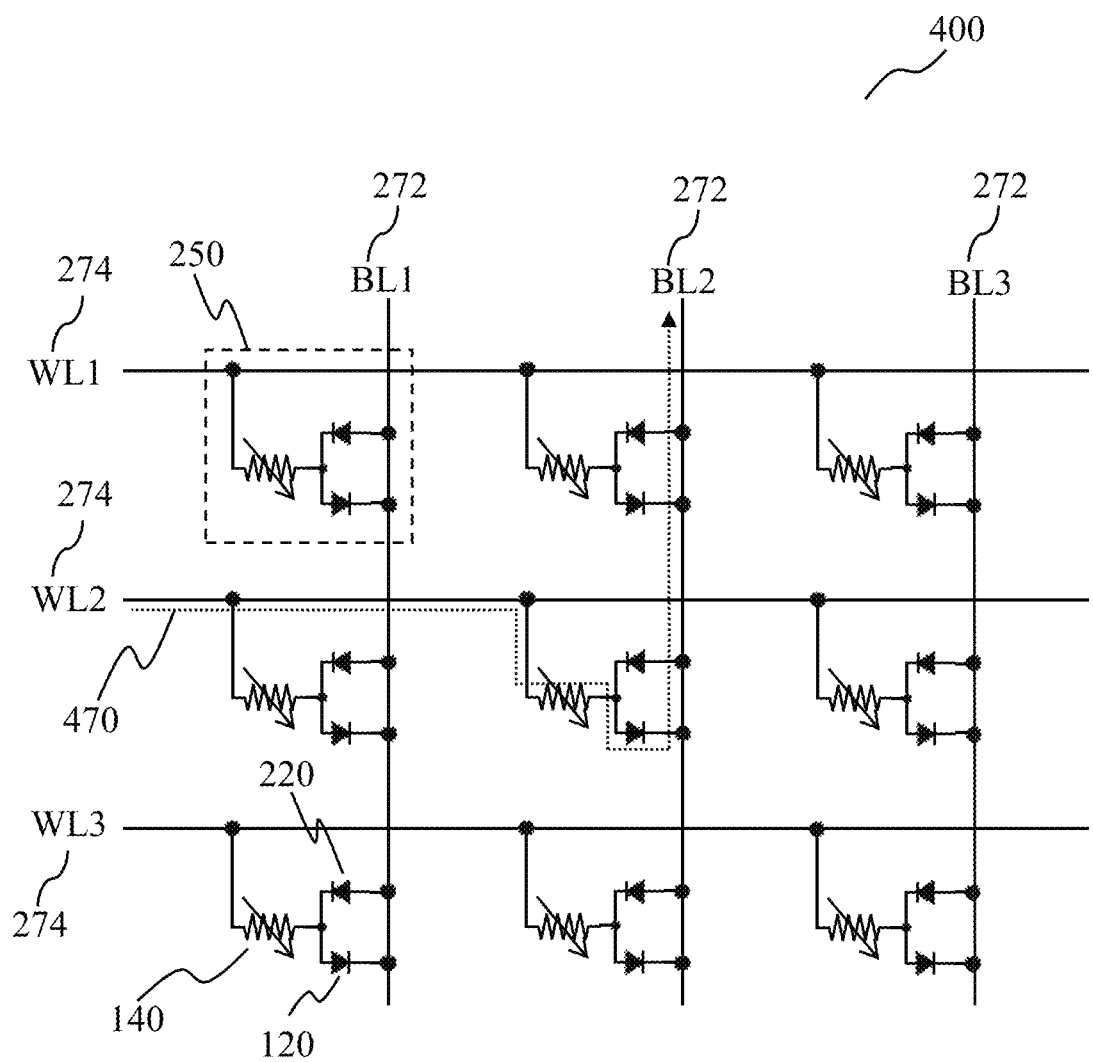
FIG. 4 shows an equivalent circuit representing the memory array of FIG. 2 according to various non-limiting embodiments.

FIG. 4 shows an equivalent circuit 400 representing the memory array 200 of FIG. 2 according to various non-limiting embodiments.

According to the non-limiting embodiments described in FIG. 2 above, each memory element 140 may be connected not only to the diode layer 122 of the respective diode 120, but also to the further diode layer 222 of the respective further diode 220 having opposite conductivity type from the diode layer 122, as shown in FIG. 3C. Accordingly, the further diode 220 may be configured to allow a current flow in a direction opposite to a direction allowed by the diode 120.

In each memory cell 250 as shown in FIG. 4, the memory element 140 is electrically connected to both the diode 120 and the further diode 220. In an exemplary embodiment where the respective diode layer 122 is the p+ diode layer and the respective further diode layer 222 is the n+ diode layer, the respective memory element 140 may be connected to the anode of the respective diode 120 and the cathode of the respective further diode 220, such that the diode 120 and the further diode 220 may be configured to allow a respective current flow in opposite directions. Accordingly, the diode 120 and the further diode 220 may be provided as two selectors configured for bipolar operation of the memory element 140.

As shown in FIG. 4, the diodes 120 and the further diodes 220 in the respective row of memory cells 250 may be electrically connected to the respective bitline 272 (BL1, BL2, BL3 . . . ) through the respective contact element 110. The respective column of memory elements 140 in the memory array 200 may be electrically connected to the respective wordline 274 (WL1, WL2, WL3 . . . ). When a predetermined bias is applied to a selected bitline and a selected wordline, the memory cell 250 connected between the selected bitline and the selected wordline may be selected for corresponding operations.

Table 1 below shows various bias condition applied to the circuit 400 of FIG. 4 according to various non-limiting embodiments.

TABLE 1

| Bipolar Bias Table | | WL (V) | BL (V) |
|---|---|---|---|
| Program | Selected | Vset | 0 |
| (Set/Forming) | Unselected | Vinhibit | Vinhibit |
| Erase | Selected | 0 | Vreset |
| | Unselected | Vinhibit | Vinhibit |
| Read | Selected | Vread | 0 |
| | Unselected | Vinhibit | Vinhibit |

To program a memory cell, e.g. the memory cell 250 connected between WL2 and BL2, the signal lines WL2 and BL2 may be the selected signal lines, and the remaining signal lines WL1, WL3, BL1, BL3 may be the unselected signal lines. According to Table 1, a voltage of Vset may be applied to the selected WL2 and a voltage of 0V may be applied to the selected BL2, so that the diode 120 in the selected memory cell 250 allows a current to flow through the current path 470 to set the selected memory cell 250. In a non-limiting example, Vset may be about 2.5V. A voltage of Vinhibit (e.g. ½V, e.g. 1.5V if a set bias V is 3V)) may be applied to the unselected signal lines WL1, WL3, BL1, BL3, to ensure that the memory cells 250 connected to these unselected signal lines are not selected.

To erase the selected memory cell 250 connected between WL2 and BL2, a voltage of Vreset may be applied to the selected BL2 and a voltage of 0V may be applied to the selected WL2, so that a current may flow from the further diode 220 to the memory element 140 in the selected memory cell 250, in an opposite direction of the current path 470, to reset the selected memory cell 250. In a non-limiting example, Vreset may be about 1.7V. A voltage of Vinhibit (e.g. ½V) may be applied to the unselected signal lines WL1, WL3, BL1, BL3, to ensure that the memory cells 250 connected to these unselected signal lines are not selected.

In a non-limiting example, the voltage of the memory element 140 in the selected memory cells may be about 1.3V in the SET operation, and may be about 0.7V in the RESET operation. The resistance of the memory element 140 may be about 10 kohm for the LRS (low resistance state) of the memory element 140, and may be about 100 kohm for the HRS (high resistance state) of the memory element 140.

According to Table 1, to read the selected memory cell 250 connected between WL2 and BL2, a voltage of Vread may be applied to the selected WL2 and a voltage of 0V may be applied to the selected BL2, so that a current is flowing through the current path 470 to read the selected memory cell 250. A voltage of Vinhibit (e.g. ½V) may be applied to the unselected signal lines WL1, WL3, BL1, BL3, to ensure that the memory cells 250 connected to these unselected signal lines are not selected.

Figure 5:
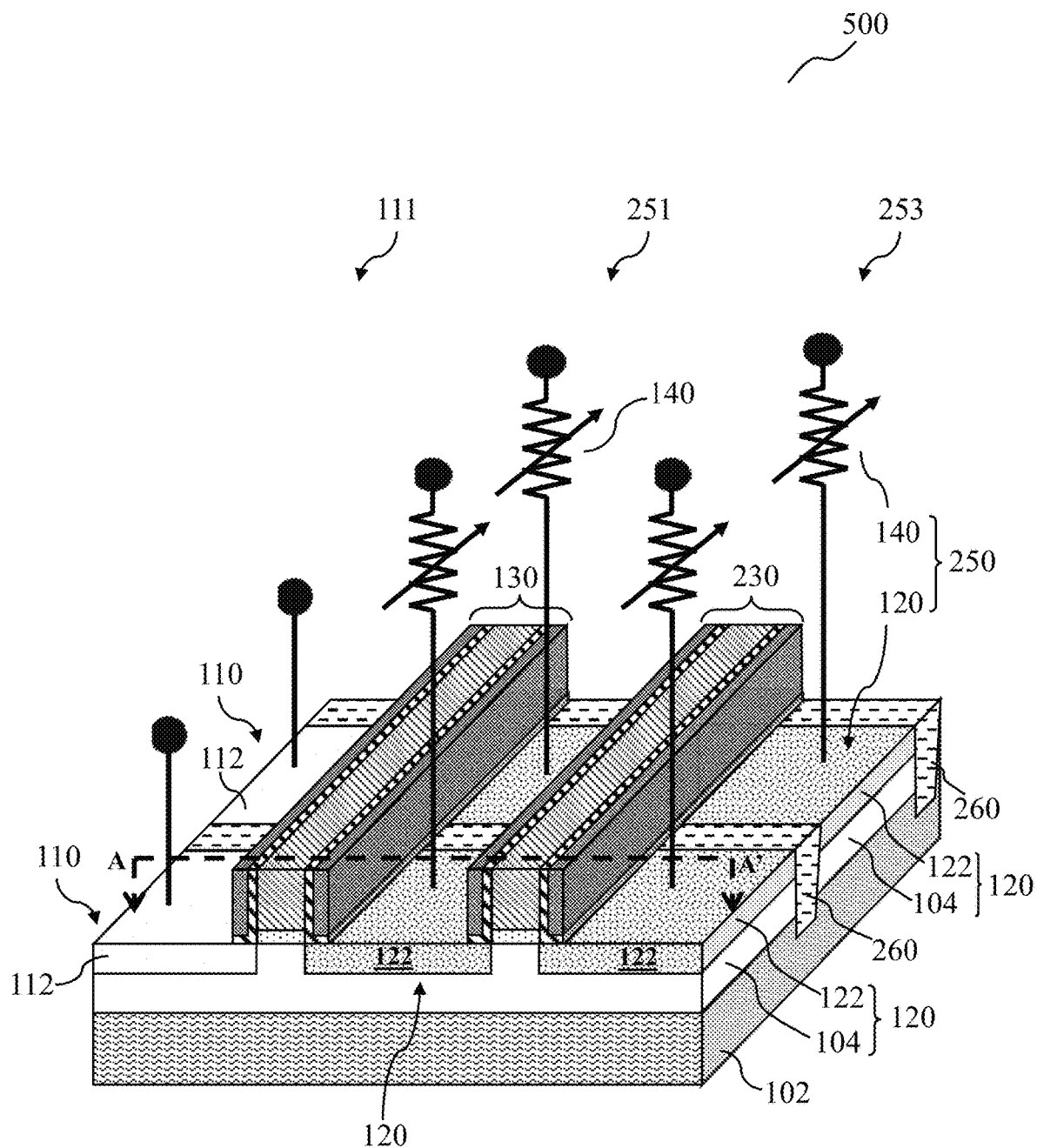
FIG. 5 shows a perspective view of a memory array according to various non-limiting embodiments.

Accordingly, the memory array 200 as illustrated in the non-limiting embodiments of FIGS. 2, 3A-3C and 4 above provide a high density 2S1R (two-selector and one-resistor) cross-point bipolar memory structure. The conventional CMOS technology may be used for the 2S1R cross-point memory array 200 without requiring additional masks. The diodes 120 and the further diodes 220, as selectors for the respective memory element 140, may be formed in source/drain regions of transistors by implantation, e.g. in the FEOL (front end of line) process. These CMOS compatible FEOL diode selectors are compact and are not constrained by thermal budget. Further, these diodes may be combined or arranged in a simple manner to achieve bipolar operation of the memory elements. The memory elements 140 may be formed between metal layers, which are arranged over the diodes 120 and the further diodes 220. The dummy gate 130 and the further dummy gates 230 may be formed as the gate region of the transistor, though the dummy gate 130 and the further dummy gates 230 are not functioning as a gate terminal of the transistor but to separate the diodes 120 and the further diodes 220. The dummy gate 130 and the further dummy gates 230 further provide compact isolation structures for isolating the memory cells 250. By utilizing the dummy gate 130 and the further dummy gates 230 for isolation, a smaller cell size in a range of about $18F^2$ to about $28F^2$ may be achieved, as compared to the cell size in a range of about $40F^2$ to about $60F^2$ in the conventional 1T1R (one-transistor and one-resistor) memory structure. FIG. 5 shows a perspective view of a memory array 500 according to various non-limiting embodiments. A cross-sectional view of the memory array 500 of FIG. 5 along line A-A' is similar to FIG. 3A and may refer to FIG. 3A accordingly. The memory array 500 may be similar to the memory array 200 of FIG. 2 and may include a plurality of memory devices similar to the memory device 100 of FIG. 1, and thus the common features are labeled with the same reference numerals. Various embodiments described with reference to FIGS. 1-2 are analogously valid for the memory array 500 of FIG. 5, and vice versa.

Similar to the memory device 100 and the memory array 200, the memory array 500 may include the substrate 102. The substrate 102 may include the well 104 having the first conductivity type. The memory array 500 may further include a plurality of columns including a plurality of memory cells 250 arranged in a matrix form, wherein the plurality of columns may include a first column 251 of memory cells and a second column 253 of memory cells. In other words, the plurality of memory cells 250 may be arranged at cross-points of the matrix. Such a memory array 500 may be referred to as a cross-point or cross-bar memory array. The memory cells 250 may also be referred to as the unit cells or bit cells of the memory array 500.

Each memory cell 250 may include the diode layer 122 arranged in the well 104, wherein the diode layer 122 has the second conductivity type opposite to the first conductivity type. Each memory cell 250 may further include the memory element 140 electrically connected to the diode layer 122.

The memory array 500 may further include a contact element column 111 including contact elements 110 arranged in the well 104, wherein each contact element 110 may include the first contact 112 having the first conductivity type. In a non-limiting embodiment shown in FIG. 5, the contact element column 111 may be arranged next to or parallel to the first column 251 of memory cells 250. Each contact element 110 may be arranged next to a respective memory cell in the first column 251 of memory cells 250, as shown in FIG. 5 and FIG. 3A.

The memory array 500 may include the dummy gate 130 configured to isolate the contact element column 111 from the diode layer 122 of each memory cell 250 in the first column 251 of memory cells. The dummy gate 130 may be arranged over a space between the first contacts 112 and the diode layers 122 in the first column 251 of memory cells 250. In other words, the dummy gate 130 may be arranged to separate or isolate the column of first contacts 112 from the neighbouring column of diode layers 122.

The memory array 500 may further include the further dummy gate 230 configured to isolate the diode layers 122 of the memory cells 250 in the first column 251 of memory cells from the diode layers 122 of the memory cells 250 in the second column 253 of memory cells. The further dummy gate 230 may be arranged over a respective space between the diode layers 122 in in the first column 251 of memory cells and the diode layers 122 in the second column 253 of memory cells. In other words, the further dummy gate 230 may be arranged to separate or isolate the neighbouring columns 251, 253 of memory cells 250. Although FIG. 5 and FIG. 3A show only two columns of memory cells and only one further dummy gate 230 arranged between the two columns of memory cells 250, it is understood that more than two columns of memory cells may be included in the memory array 500, and more than one further dummy gate 230 may be included when more than two columns of memory cells 250 are included in the memory array 500.

As shown in FIG. 5, the memory array 500 may further include a plurality of isolation elements 260 arranged in a column in the substrate 102, wherein the isolation elements 260 are configured to isolate the diode layers 122 of the memory cells within a same column of memory cells. In other words, the isolation elements 260 may be arranged to separate or isolate the diode layers 122 of neighbouring memory cells 250 within the same column. As shown in FIG. 5, the respective isolation element 260 may also be arranged between the neighbouring first contacts 112. The isolation element 260 may include a STI (shallow trench isolation) extending into the substrate 102.

Similar to the non-limiting embodiments described above, the first conductivity type may be N type and the second conductivity type may be P type. Accordingly, the well 104 may be the N-well, which may include a plurality of portions separated by the isolation elements 260. The first contacts 112 may be n+ contacts, and the diode layers 122 may be p+ diode layers. The doping concentration of the first contacts 112 and the doping concentration of the diode layers 122 may be higher than the doping concentration of the well 104. In a non-limiting embodiment, the doping concentration of the well 104 may be in a range from about $1\times10^{16}$ cm$^{-3}$ to about $1\times10^{17}$ cm$^{-3}$. The doping concentration of the first contact 112 and the doping concentration of the diode layer 122 may be in a range from about $1\times10^{18}$ cm$^{-3}$ to about $1\times10^{20}$ cm$^{-3}$. It is to be noted that these ranges of the doping concentration for the well 104, the first contact 112 and the diode layer 122 are non-limiting examples only. It is understood that any suitable doping concentration for a well in semiconductor processes may be applied for the well 104, and any suitable doping concentration for source and drain regions in semiconductor processes may be applied for the first contact 112 and the diode layer 122. In alternative non-limiting embodiments, the first conductivity type may be P type and the second conductivity type may be N type.

The substrate 102 may include a silicon substrate, a SOI (silicon-on-insulator) substrate, a germanium substrate, or any other suitable types of semiconductor substrates. Accordingly, the well 104, the first contacts 112 and the diode layers 122 may be doped regions formed in the substrate 102.

Each memory element 140 may be a resistive memory, such as a resistive random access memory (ReRAM), or a phase change random access memory (PCRAM). The memory element 140 may include an oxide layer or a resistive dielectric layer between two electrodes.

According to various non-limiting embodiments, a respective diode layer 122 and at least a portion of the well 104, for example, a portion of the well 104 adjacent to the respective diode layer 122, may form a diode 120 for each memory cell 250. Accordingly, the respective diode layer 122 and the respective portion of the well 104 having opposite conductivity type with each other may thus form a respective PN diode 120 for each memory cell 250.

Different from the memory array 200, the memory cells 250 in the memory array 500 may include only the diode 120, but may not include the further diode 220 illustrated in the memory array 200. Accordingly, the memory cells 250 in the memory array 500 does not include the channel layer 206 and the further diode layer 522 illustrated in the memory array 200.

As illustrated in the cross-sectional view of FIG. 3A, the dummy gate 130 and the further dummy gate 230 may each include a gate dielectric layer 132, a gate layer 134 arranged over the gate dielectric layer 132, and an insulating spacer 136 surrounding the gate dielectric layer 132 and the gate layer 134. The gate dielectric layer 132 may be arranged over the well 104, and may include a dielectric material, such as an oxide material, e.g., silicon oxide. The gate layer 134 may include poly-silicon, or metal, such as Al, TaN, or TiN. The insulating spacer 136 may be arranged over the first contacts 112 and the diode layers 122, and may include an insulating material, e.g., silicon oxide, silicon nitride, or a combination thereof. In a non-limiting embodiment, the insulating spacer 136 may include an inner spacer 137 and an outer spacer 138 at least partially surrounding the inner spacer 137. In a non-limiting example, the inner spacer 137 may include silicon oxide, and the outer spacer 138 may include silicon nitride.

The dummy gate 130 may be configured to separate or isolate the respective contact element 110 in the contact element column 111 from the respective diode 120 in the first column 251 of memory cells. The further dummy gate 230 may be configured to separate or isolate the diodes 120 in neighbouring columns 251, 253 of memory cells. Said differently, the further dummy gate 230 may isolate or separate a diode or diodes of a first column 251 of memory cells from a diode or diodes of a second column 253 of memory cells. In an exemplary non-limiting embodiment, no voltage is applied to the dummy gate 130 and the further dummy gate 230, such that the dummy gate 130 and the further dummy gate 230 are not functioning as the gate terminal of a transistor. The dummy gate 130 and the further dummy gate 230 may be easily formed in the CMOS process without additional steps or processes, and at the same time provide a more compact structure compared to STI structure. In alternative non-limiting embodiments, the dummy gate 130 and the further dummy gate 230 may be biased to reduce a sneak current which may flow through unselected memory cells 250 through a selected wordline and a selected bitline. To reduce or eliminate the sneak current, the dummy gate 130 and/or the further dummy gate 230 located along a current path of a selected memory cell 250 may be supplied with a half forward bias to assist formation of a channel under the corresponding dummy gate and/or the corresponding further dummy gate 230, while the further dummy gate 230 not located along the current path of the selected memory cell may be supplied with a half reverse bias to ensure that the channel is off under the corresponding further dummy gate. Accordingly, current may only pass through the selected memory cell to prevent the sneak current effect.

Each contact element 110 may be electrically connected to a respective first signal line (as shown in FIG. 12F), e.g., a bitline (BL). Each column of memory elements 140 may be electrically connected to a respective second signal line (as shown in FIG. 12F), e.g., a wordline (WL). In alternative non-limiting embodiments, the first signal line may be a wordline, and the second signal line may be a bitline.

When a predetermined bias is applied to a selected bitline and a selected wordline, the memory cell 250 connected between the selected bitline and the selected wordline may be selected and operated accordingly, as described with reference to FIG. 6 and FIG. 7 below.

Figure 6:
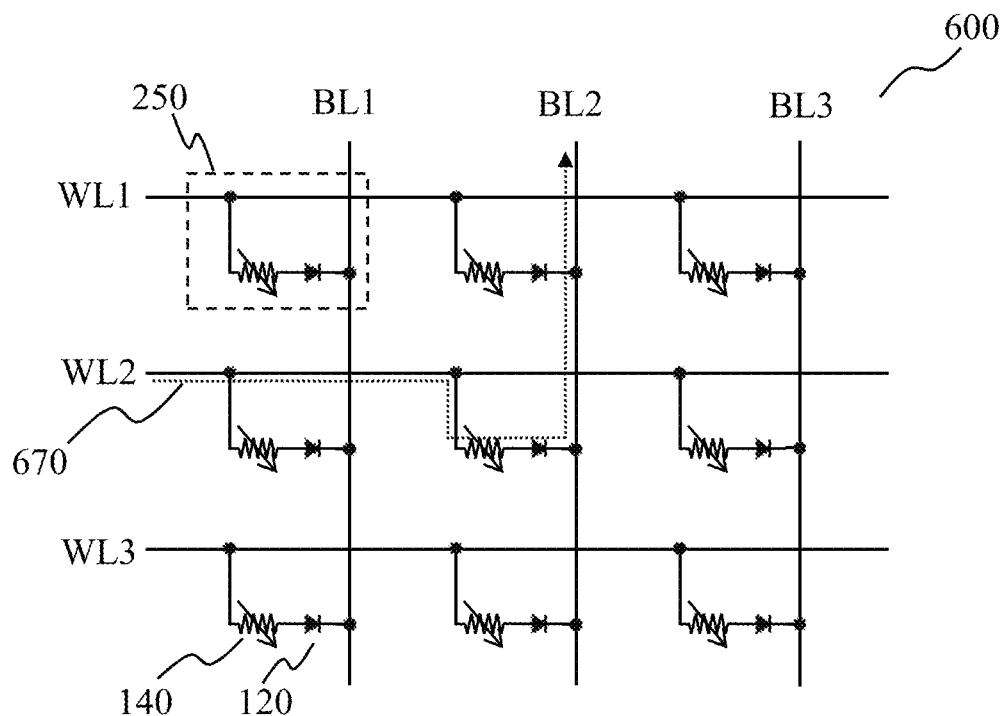
FIG. 6 and FIG. 7 show a respective equivalent circuit representing the memory array of FIG. 5 according to various non-limiting embodiments.
Figure 7:
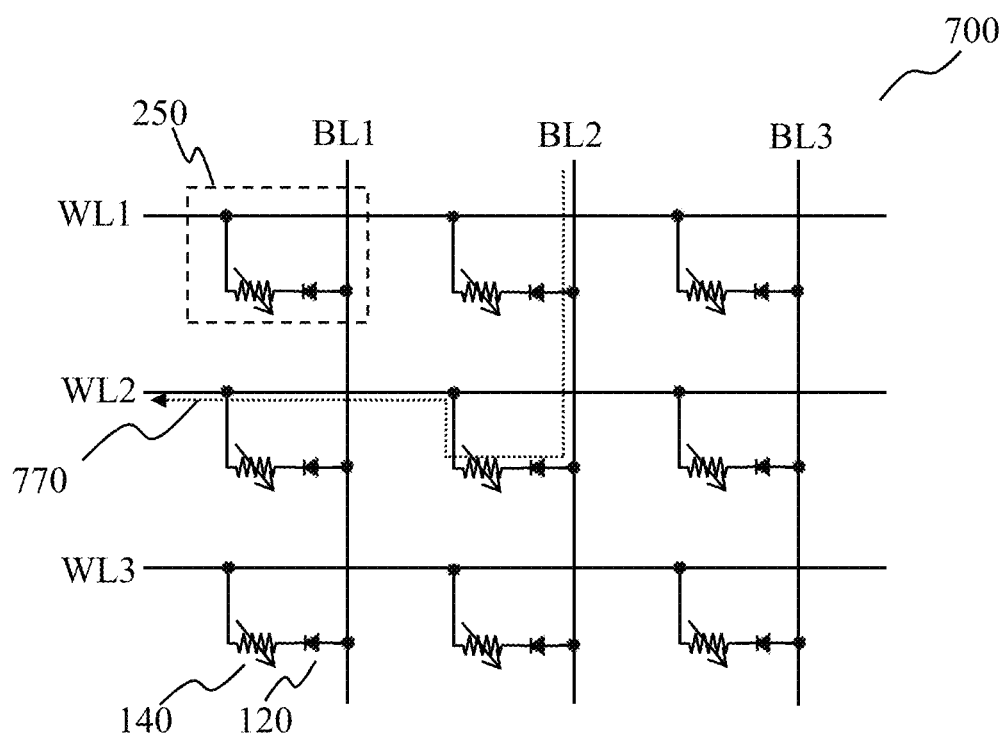

FIG. 6 and FIG. 7 show a respective equivalent circuit 600, 700 representing the memory array 500 of FIG. 5 according to various non-limiting embodiments.

In non-limiting embodiments of FIG. 6 where the respective diode layer 122 is a p+ diode layer, the respective memory element 140 may be connected to the p+ diode layer, i.e. an anode of a respective PN diode 120, such that each diode 120 is configured to allow a current flow in a single direction from the respective memory element 140 to the respective diode 120.

In alternative non-limiting embodiments of FIG. 7 where the respective diode layer 122 is a n+ diode layer, the respective memory element 140 may be connected to a cathode of a respective PN diode 120, such that each diode 120 is configured to allow a current flow in a single direction from the respective diode 120 to the respective memory element 140. Accordingly, the respective diode 120 may be a selector configured for unipolar operation of the respective memory element 140.

The diodes 120 arranged in each row in the memory array 500 of FIG. 5 may be electrically connected to the respective bitline (BL1, BL2, BL3 . . . ) through the respective contact element 110, and each column 251, 253 of memory elements 140 in the memory array 200 of FIG. 2 may be electrically connected to the respective wordline (WL1, WL2, WL3 . . . ) at the other terminal of the memory elements 140. When a predetermined bias is applied to a selected bitline and a selected wordline, the memory cell 250 connected between the selected bitline and the selected wordline may be selected for corresponding operation.

Table 2 below shows various bias condition applied to the circuit 600, 700 of FIG. 6 and FIG. 7 according to various non-limiting embodiments.

TABLE 2

| Unipolar Bias Table | | WL (V) | BL (V) |
| --- | --- | --- | --- |
| Program (Set/Forming) | Selected | Vset | 0 |
| | Unselected | Vinhibit | Vinhibit |
| Erase | Selected | Vreset | 0 |
| | Unselected | Vinhibit | Vinhibit |
| Read | Selected | Vread | 0 |
| | Unselected | Vinhibit | Vinhibit |

To program a memory cell, e.g. the memory cell 250 connected between WL2 and BL2, the signal lines WL2 and BL2 may be the selected signal lines, and the remaining signal lines WL1, WL3, BL1, BL3 may be the unselected signal lines. According to Table 2, a voltage of Vset may be applied to the selected WL2 and a voltage of 0V may be applied to the selected BL2, so that a current is flowing through the current path 670, 770 to set the selected memory cell 250. In a non-limiting example, Vset may be about 2.5V in the embodiments of FIG. 6, and Vset may be about −2.5V in the embodiments of FIG. 7. A voltage of Vinhibit (e.g. ½V, e.g. 1.5V if a set bias V is 3V) may be applied to the unselected signal lines WL1, WL3, BL1, BL3, to ensure that the memory cells 250 connected to these unselected signal lines are not selected.

Similarly, to erase the selected memory cell 250 connected between WL2 and BL2, a voltage of Vreset may be applied to the selected WL2 and a voltage of 0V may be applied to the selected BL2, so that a current is flowing through the current path 670, 770 to reset the selected memory cell 250. In a non-limiting example, Vreset may be about 1.7V in the embodiments of FIG. 6, and Vset may be about −1.7V in the embodiments of FIG. 7. A voltage of Vinhibit (e.g. ½V) may be applied to the unselected signal lines WL1, WL3, BL1, BL3, to ensure that the memory cells 250 connected to these unselected signal lines are not selected.

Similarly, to read the selected memory cell 250 connected between WL2 and BL2, a voltage of Vread may be applied to the selected WL2 and a voltage of 0V may be applied to the selected BL2, so that a current is flowing through the current path 670, 770 to read the selected memory cell 250. A voltage of Vinhibit (e.g. ½V) may be applied to the unselected signal lines WL1, WL3, BL1, BL3, to ensure that the memory cells 250 connected to these unselected signal lines are not selected.

Accordingly, the memory array 500 as illustrated in the non-limiting embodiments of FIG. 5 above provide a high density 1S1R (one-selector and one-resistor) cross-point unipolar memory structure. The conventional CMOS technology may be used for the 1S1R cross-point memory array 500 without requiring additional masks. The diodes 120, as selectors for the respective memory element, may be formed in source/drain regions of a transistor by implantation, e.g. in the FEOL (front end of line) process. These CMOS compatible FEOL diode selectors are compact and are not constrained by thermal budget. Further, these diodes may be combined or arranged in a simple manner to achieve unipolar operation of the memory elements. The memory elements 140 may be formed between metal layers, which are arranged over the diodes 120. The dummy gate 130 and the further dummy gate 230 may be formed as the gate region of the transistor, though the dummy gate 130 and the further dummy gate 230 are not functioning as a gate terminal of the transistor but to separate the diodes 120. The dummy gate 130 and the further dummy gate 230 further provide compact isolation structures for isolating the memory cells 250. By utilizing the dummy gate 130 and the further dummy gates 230 for isolation, a smaller cell size in a range of about $8F^2$ to about $27F^2$ may be achieved, as compared to the cell size in a range of about $40F^2$ to about $60F^2$ in the conventional 1T1R (one-transistor and one-resistor) memory structure.

Figure 8:
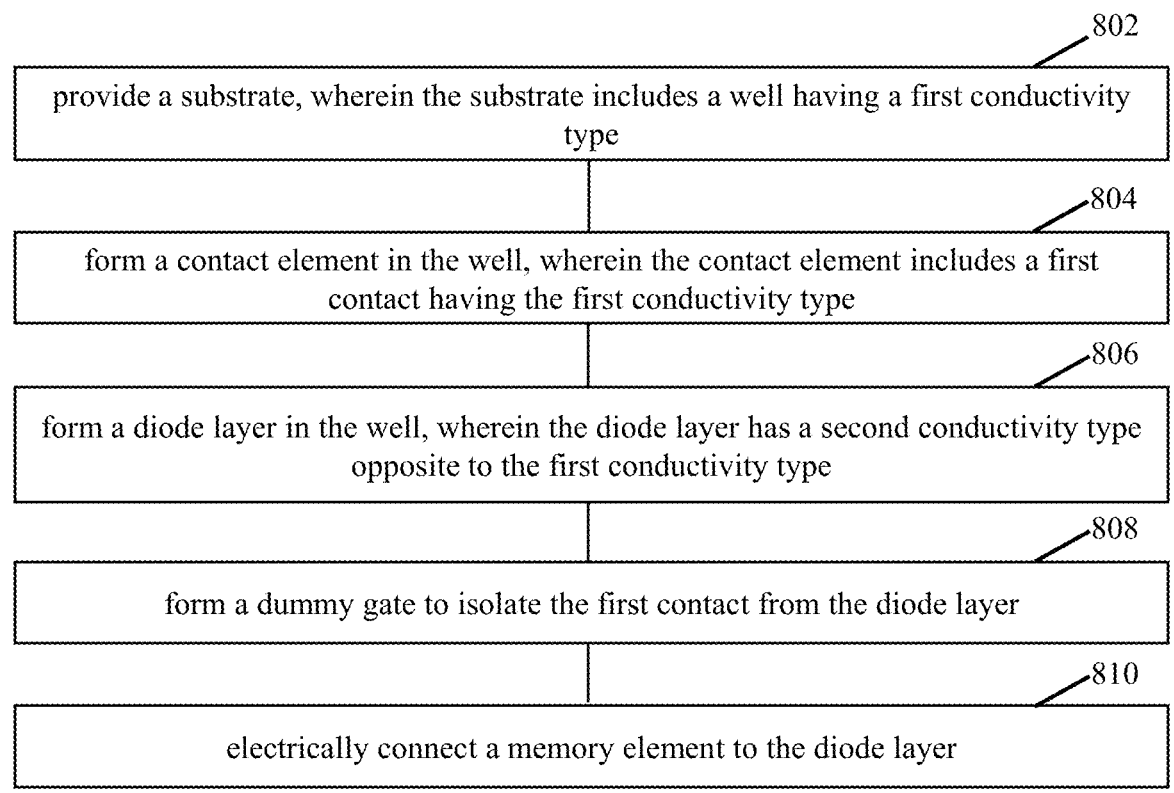
FIG. 8 shows a flowchart illustrating a method of forming a memory device according to various non-limiting embodiments.

FIG. 8 shows a flowchart 800 illustrating a method of forming a memory device according to various non-limiting embodiments. The method may be used to form the memory device 100 described in various non-limiting embodiments above. Various non-limiting embodiments described in context of the memory device 100 are analogously valid for the method of FIG. 8, and vice versa.

At 802, a substrate may be provided. The substrate may include a well having a first conductivity type.

At 804, a contact element may be formed in the well. The contact element may include a first contact having the first conductivity type.

At 806, a diode layer may be formed in the well. The diode layer may have a second conductivity type opposite to the first conductivity type.

At 808, a dummy gate may be formed to isolate the first contact from the diode layer.

At 810, a memory element may be electrically connected to the diode layer.

It is understood that the method may not be carried out in the sequence of 802-810 according to various embodiments. For example, the forming of the dummy gate at 808 may be carried out before the forming of the diode layer at 806 according to a non-limiting embodiment.

According to various non-limiting embodiments, the method may further include forming a channel layer in the well, wherein the channel layer may have the second conductivity type.

According to various non-limiting embodiments, the method may further include forming a further diode layer in the channel layer and electrically connecting the further diode layer to the memory element. The further diode layer may have the first conductivity type. The further diode layer and at least a portion of the channel layer may form the further diode.

According to various non-limiting embodiments, the method may further include forming a second contact in the channel layer and forming a third contact in the well. The second contact may have the second conductivity type, and the third contact may have the first conductivity type.

According to various non-limiting embodiments, the method may further include forming an isolation element in the substrate. The isolation element may be arranged between the diode layer and the further diode layer. In a non-limiting example, the isolation element may include a STI (shallow trench isolation) extending into the substrate. The method may further include forming an isolation well under the isolation element, wherein the isolation well may have the second conductivity type. The isolation well may extend further into the substrate from the bottom of the isolation element.

In the method of FIG. 8, the contact element and the diode layer may be formed similar to the source and drain regions of a transistor, and the dummy gate may be formed similar to the gate region of the transistor. Accordingly, the process of forming the contact element, the diode layer and the dummy gate may be similar to the process of forming a transistor, and is accordingly compatible with the CMOS process.

Figure 9:
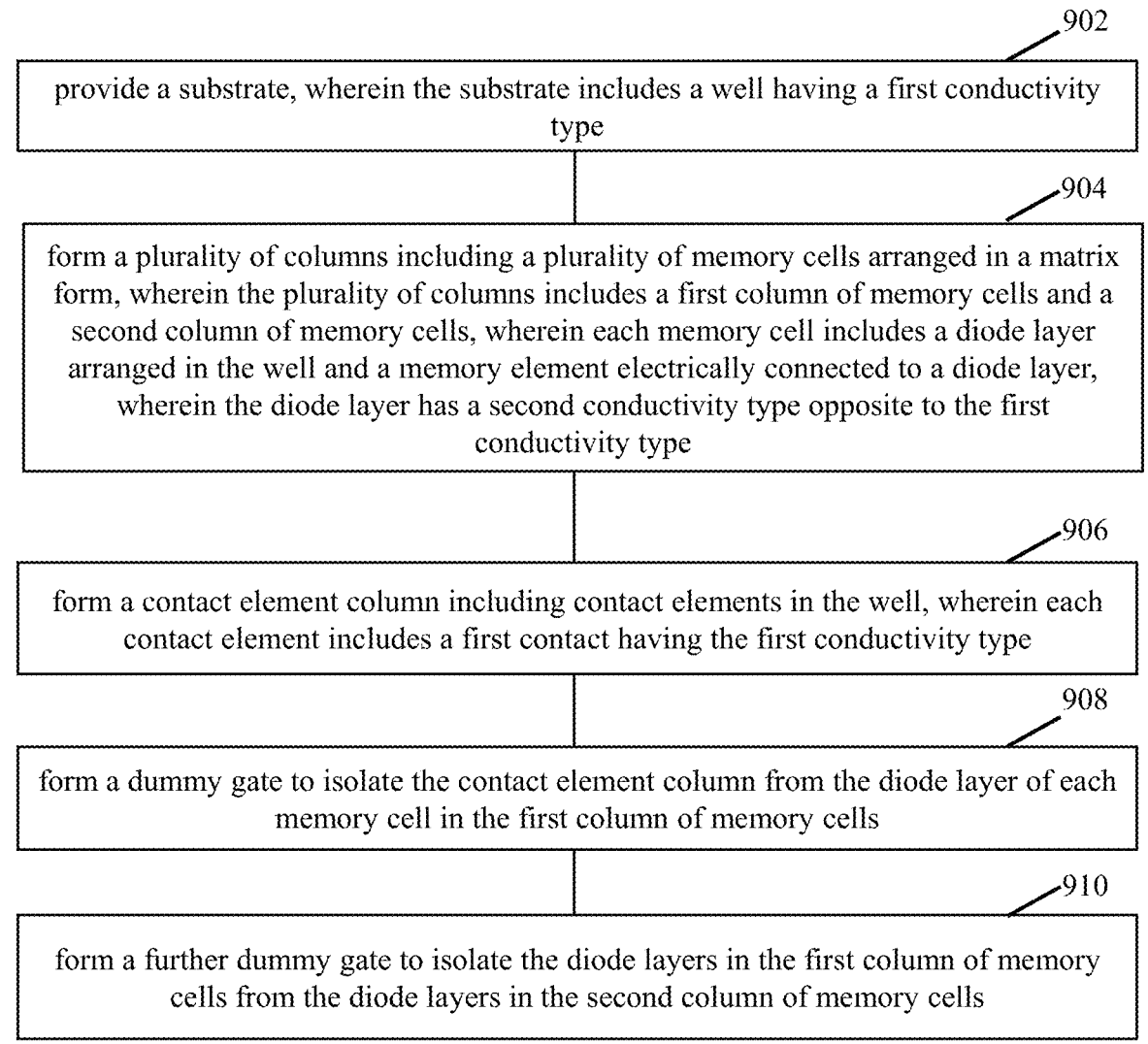
FIG. 9 shows a flowchart illustrating a method of forming a memory array according to various non-limiting embodiments.

FIG. 9 shows a flowchart 900 illustrating a method of forming a memory array according to various non-limiting embodiments. The method may be used to form the memory array 200, 500 described in various non-limiting embodiments above. Various non-limiting embodiments described in context of the memory array 200, 500 are analogously valid for the method of FIG. 9, and vice versa.

At 902, a substrate may be provided, wherein the substrate includes a well having a first conductivity type.

At 904, a plurality of columns including a plurality of memory cells arranged in a matrix form may be formed, wherein the plurality of columns includes a first column of memory cells and a second column of memory cells. Each memory cell may include a diode layer arranged in the well and a memory element electrically connected to the diode layer. The diode layer may have a second conductivity type opposite to the first conductivity type At 906, a contact element column including contact elements may be formed in the well, wherein each contact element includes a first contact having the first conductivity type.

At 908, a dummy gate may be formed to isolate the contact element column from the diode layer of each memory cell in the first column of memory cells.

At 910, a further dummy gate may be formed to isolate the diode layers in the first column of memory cells from the diode layers in the second column of memory cells.

It is understood that the method may not be carried out in the sequence of 902-910 according to various embodiments. For example, the forming of the dummy gate at 908 and the forming of the further dummy gate at 910 may be carried out before the forming of the contact elements at 906 according to a non-limiting embodiment.

Forming each of the dummy gate and the further dummy gate may include forming a gate dielectric layer, forming a gate layer over the gate dielectric layer, and forming an insulating spacer to surround the gate dielectric layer and the gate layer.

In various non-limiting embodiments, the method may further include forming a plurality of isolation elements in a column in the substrate. The isolation elements may be configured to isolate the diode layers of the memory cells within a same column of memory cells.

According to various non-limiting embodiments, the method may further include forming a channel layer in the well, wherein the channel layer may have the second conductivity type. The method may further include forming a further diode layer in the channel layer and electrically connecting the further diode layer to the memory element. The further diode layer may have the first conductivity type. The further diode layer and at least a portion of the channel layer may forma further diode.

The method may further include forming a plurality of isolation elements in a column in the substrate and forming a respective isolation well under the respective isolation element. The respective isolation element may be arranged between the diodes and the further diode in each column of memory cells. In a non-limiting example, the isolation element may include a STI extending into the substrate. The isolation wells may have the second conductivity type. The isolation well may extend further into the substrate from the bottom of the isolation element.

According to various non-limiting embodiments, forming the contact element column may include forming a plurality of second contacts in the channel layers and forming a plurality of third contacts in the well. The second contacts may have the second conductivity type, and the third contacts may have the first conductivity type.

The dummy gate may be configured to isolate the plurality of second contacts in the contact element column from the further diode layers in the first column of memory cells. In a non-limiting embodiment, the dummy gate may be arranged over a space between the second contacts in the contact element column and the further diode layers in the first column of memory cells. The further dummy gate may be configured to isolate the further diode layers in the first column of memory cells from the further diode layers in the second column of memory cells. The further dummy gate may be arranged over a respective space between the further diode layers in neighbouring columns of memory cells.

In various non-limiting embodiments, the method may further include electrically connecting each contact element to a respective first signal line, and electrically connecting each column of memory elements to a respective second signal line.

Various non-limiting embodiments of the method of forming the memory device 100 and the memory array 200, 500 will be described in more detail below.

FIGS. 10A-10F illustrate a method of forming a memory array according to various non-limiting embodiments. In the non-limiting embodiments of FIGS. 10A-10F, the method of forming the memory array 200 is illustrated. Various non-limiting embodiments described in context of the memory array 200 above and the method of FIG. 9 are analogously valid for the method of FIGS. 10A-10F, and vice versa. It is understood that the method of FIGS. 10A-10F may be similarly used to form the memory device 100 of FIG. 1 including a single memory cell of the memory array 200. Various non-limiting embodiments described in context of the memory device 100 above and the method of FIG. 8 are analogously valid for the method of FIGS. 10A-10F, and vice versa.

Figure 10A:
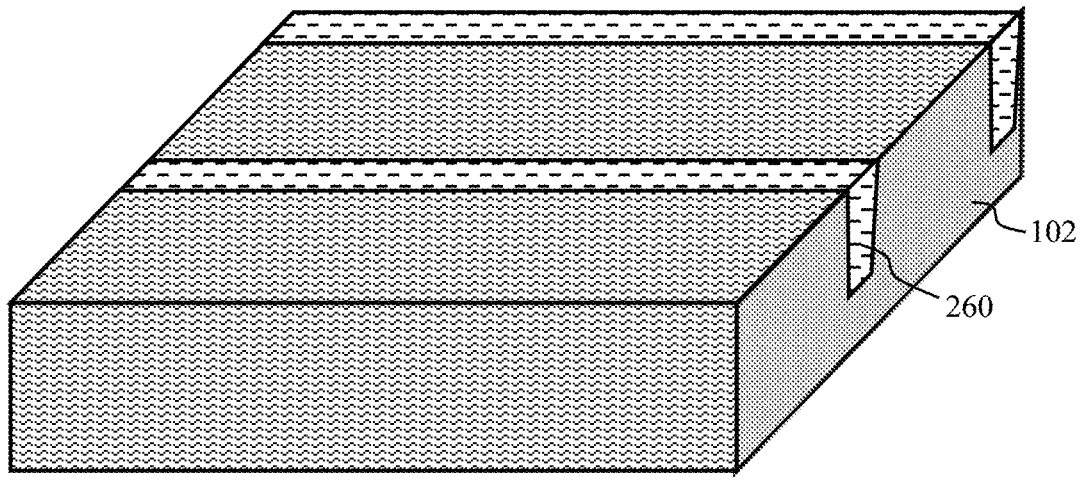
FIGS. 10A-10F illustrate a method of forming a memory array according to various non-limiting embodiments.

In FIG. 10A, a substrate 102 may be provided. The substrate 102 may include a silicon substrate, a SOI (silicon-on-insulator) substrate, a germanium substrate, or any other suitable types of semiconductor substrates. A plurality of isolation elements 260 may be formed in a column in the substrate 102. The isolation elements 260 may be formed as STI, and may be arranged in a column similar to the structure of FIG. 2.

Figure 10B:
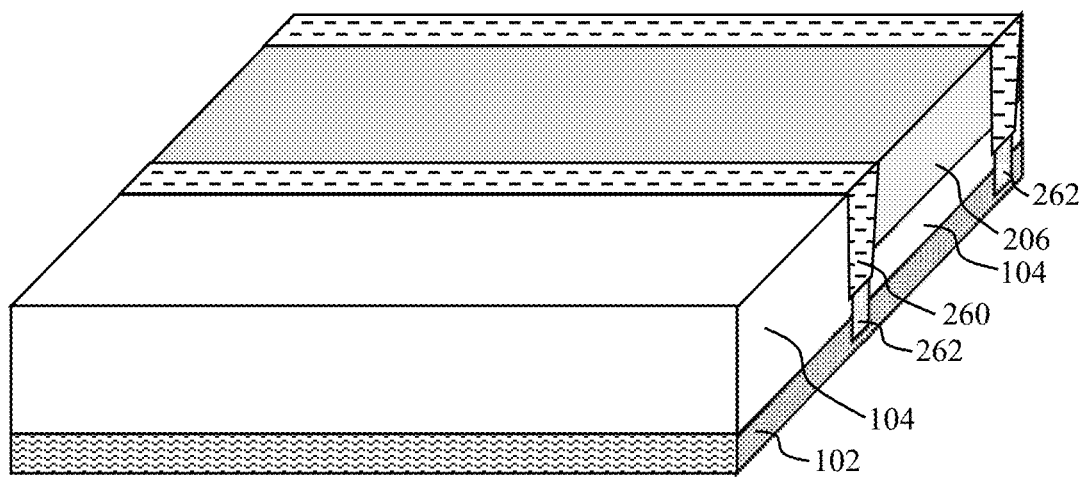

In FIG. 10B, a well 104 having a first conductivity type may be formed in the substrate 102, e.g., by ion implantation. The well 104 may include one or more portions separated by the isolation elements 260. A channel layer 206 having a second conductivity type may be formed in the well 104, for example, in selected portions of the well 104 where a further diode may be formed.

In the process of FIG. 10B, a plurality of isolation wells 262 may be formed under the respective isolation elements 260, and may also be arranged in a column. The isolation wells 262 may extend further into the substrate 102 from the bottom of the isolation elements 260. The isolation wells 262 may have the second conductivity type. In a non-limiting embodiment where the well 104 is N-well, the isolation wells 262 may be P-well which, along with the isolation element 260, may be configured to isolate the diode 120 from the neighbouring further diode 220 arranged in the well 104 as illustrated in FIG. 2 above.

Figure 10C:
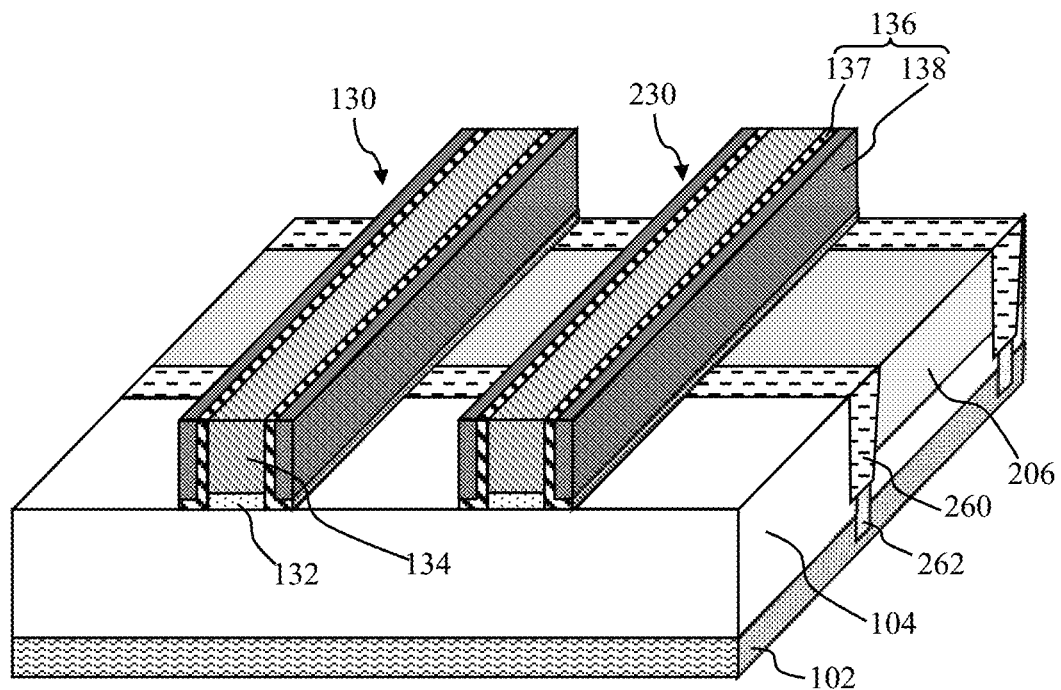

In FIG. 10C, a dummy gate 130 and a further dummy gate 230 may be formed over the well 104 and the channel layer 206. The dummy gate and the further dummy gate 230 may each include a gate dielectric layer 132 arranged over the well 104, a gate layer 134 arranged over the gate dielectric layer 132, and an insulating spacer 136 surrounding the gate dielectric layer 132 and the gate layer 134. The gate dielectric layer 132 may include a dielectric material, such as an oxide material, e.g., silicon oxide. The gate layer 134 may include poly-silicon, or metal, such as Al, TaN, or TiN. The insulating spacer 136 may be arranged over the well 104, and may include an insulating material, e.g., silicon oxide, silicon nitride, or a combination thereof. In a non-limiting embodiment, the insulating spacer 136 may include an inner spacer 137 and an outer spacer 138 at least partially surrounding the inner spacer 137. In a non-limiting example, the inner spacer 137 may include silicon oxide, and the outer spacer 138 may include silicon nitride.

As shown in FIG. 10C, the isolation elements 260 may extend in a first direction, while the dummy gate 130 and the further dummy gate 230 may extend in a second direction perpendicular to the first direction. In this manner, the isolation elements 260 may be configured to isolate diodes and further diodes of memory cells arranged along the second direction, while the dummy gate 130 and the further dummy gate 230 may be configured to isolate the memory cells arranged along the first direction.

Figure 10D:
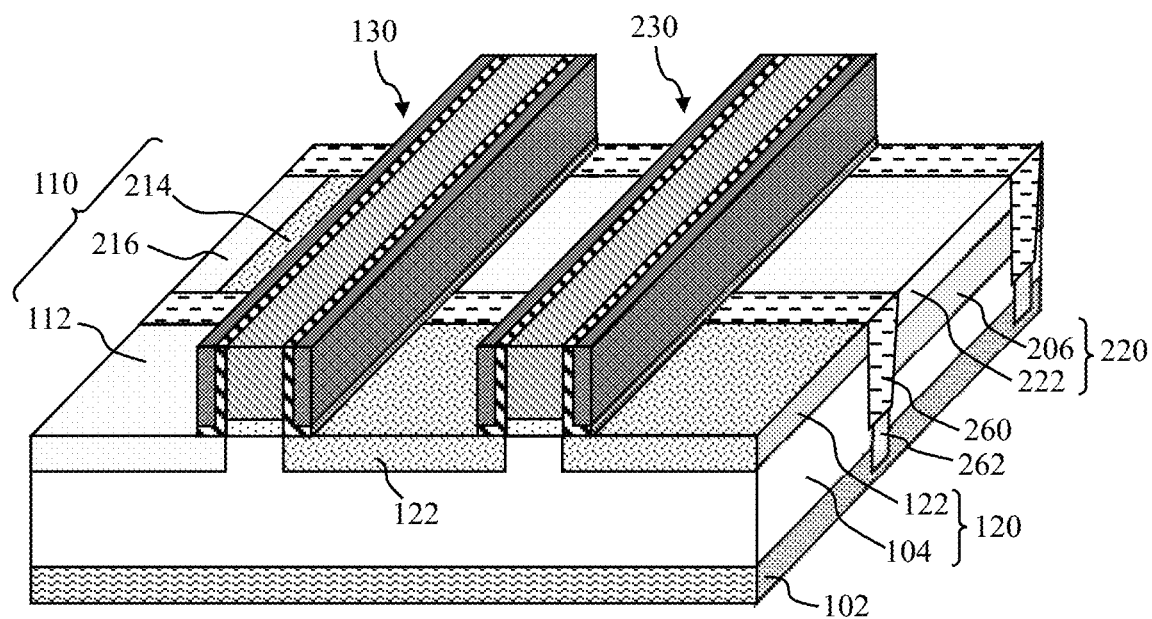

In FIG. 10D, a plurality of contact elements 110, diodes 120 and further diodes 220 may be formed. In the non-limiting embodiments illustrated in FIG. 10D, only one contact element 110 corresponding to a single row of memory cells is shown. It is understood that the method of FIGS. 10A-10F may be used to form the memory array including multiple rows of memory cells and multiple contact elements corresponding thereto.

The forming of the contact element 110 may include forming a first contact 112 in the well 104. The forming of the contact elements 110 may further include forming a second contact 214 in the channel layer 206 and forming a third contact 216 in the well 104. The first contact 112 and the third contact 216 may have the first conductivity type, and the second contact 214 may have the second conductivity type.

The forming of the diodes 120 may include forming a plurality of diode layers 122 in the well 104. The diode layers 122 may have the second conductivity type. The forming of the further diodes 220 may include forming a plurality of further diode layer 222 in the channel layer 206, wherein the further diode layers 222 have the first conductivity type.

In a non-limiting embodiment where the first conductivity type is N type, the well 102 may be N-well, and the channel layer 206 may be P-channel. The first contact 112, second contact 214, and the third contact 216 may be formed as n+ contact, p+ contact, and n+ contact, respectively. The diode layers 122 and the further diode layers 222 may be formed as p+ diode layers and n+ diode layers, respectively. The respective contacts 112, 214, 216 and the respective diode layers 122, 222 may be formed as doped regions in the well 102 and the channel layer 206, e.g. by ion implantation.

As shown in FIG. 10D, the first contact 112 and the second contact 214 may be spaced apart from the diode layer 122 and the further diode layer 222, such that the dummy gate 130 may be arranged over a space between the first contact 112 and the diode layer 122, and over a space between the second contact 214 and the further diode layer 222. Accordingly, the dummy gate 130 may be arranged to separate the contact element 110 from the neighbouring memory cell 250. The further dummy gate 230 may be arranged over a space between the diode layers 122 from neighbouring columns, and over a space between the further diode layers 222 from neighbouring columns. Accordingly, the further dummy gate 230 may be arranged to separate the memory cells 250 from neighbouring columns.

The isolation elements 260 may extend to the region of the well 104 where the contact element 110 is arranged, so as to separate the first contact 112 from the second contact 214 and the third contact 216.

Figure 10E:
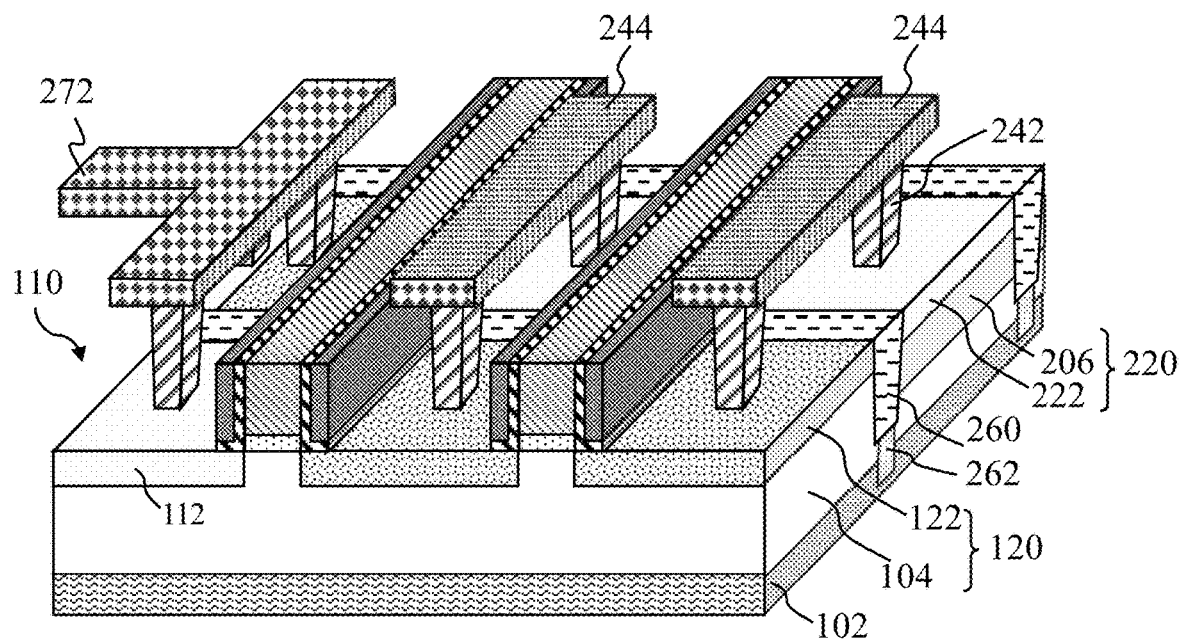

In FIG. 10E, interconnects 242 may be formed over the first contacts 112, the second contact 214 and the third contact 216. Metal layers may be formed further over the interconnects 242 for functioning as first signal lines 272, e.g. bitlines or wordlines. Interconnects 242 may also be formed over the diode layers 122 and the further diode layers 222, and metals layers 244 may be further formed over the interconnects 242 for electrical connection to memory elements as illustrated in FIG. 10F below.

In the contact element 110, the first contact 112 may be configured to electrically connect to the respective diode 120 through the well 104. The second contact 214 may be configured to electrically connect to the respective further diode 220 through the channel layer 206. As shown in FIG. 10E, the second contact 214 may be electrically connected with the third contact 216. This is to ensure that the channel layer 206 and the well 104, having different conductivity types and having the second contact 214 and the third contact 216 respectively arranged therein, are at the same bias so that a diode is not formed therebetween.

Figure 10F:
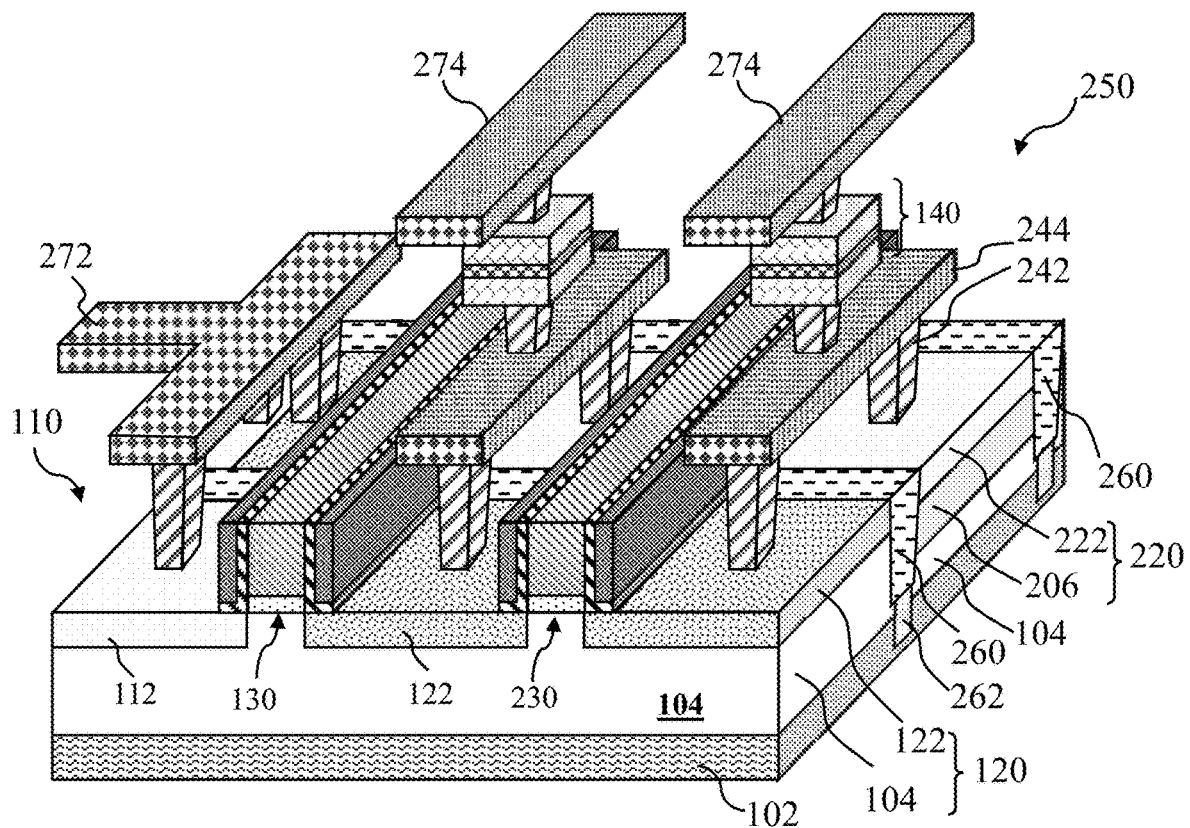

In FIG. 10F, a plurality of memory elements 140 may be arranged or formed over the respective diode layer 122 and the respective further diode layer 222, and may be electrically connected to the respective diode layer 122 and the respective further diode layer 222 through one or more interconnects. Each memory element 140 may have one terminal connected to both a diode 120 and a further diode 220, where the diode 120 and the further diode 220 are electrically connected in parallel. Accordingly, a respective memory cell 250 including the memory element 140, the diode 120 and the further diode 220 may be formed. Metal layers 274 may be formed on the respective memory elements 140, which may function as second signal lines 274, e.g., wordlines or bitlines. Accordingly, the structure formed in FIG. 10F may be a 2S1R memory array, similar to the memory array 200 described in FIG. 2 above.

By applying the predetermined voltages to the selected first signal line 272 and the selected second signal line 274, the corresponding diode 120 and further diode 220 may be configured to select the memory element 140 for bipolar operation of the memory element 140 as described with reference to FIG. 4 above.

Additional interlayer dielectric (not shown in FIG. 10F) may be formed to isolate the memory elements 140 from each other, and to isolate the interconnects 242, the metals layer 244 and the signal lines 272, 274 from each other. Conventional BEOL processes may be further carried out for fabrication of further interconnects and metal layers.

Figure 11A:
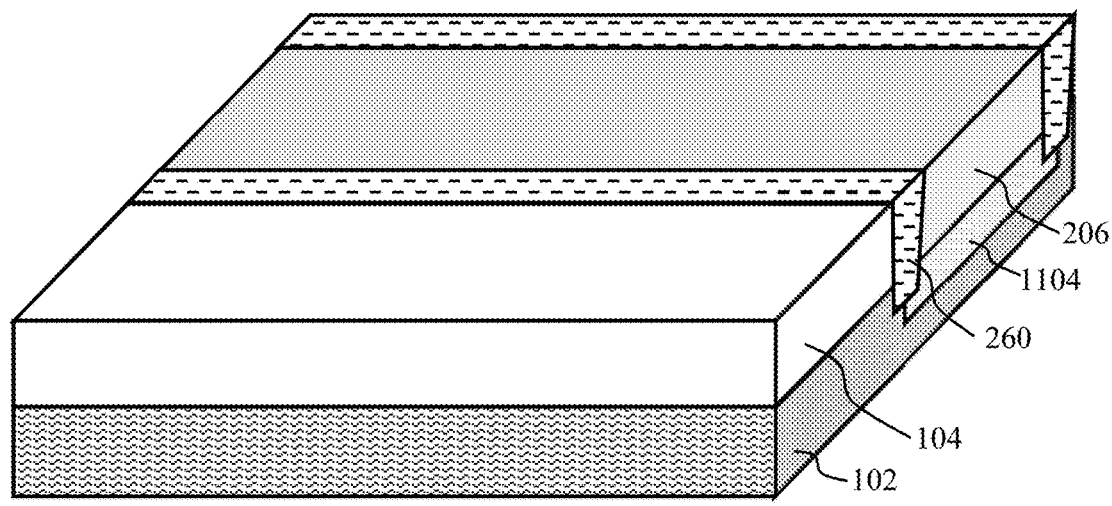
FIGS. 11A-11B illustrate processes in forming a memory array according to various non-limiting embodiments.
Figure 11B:
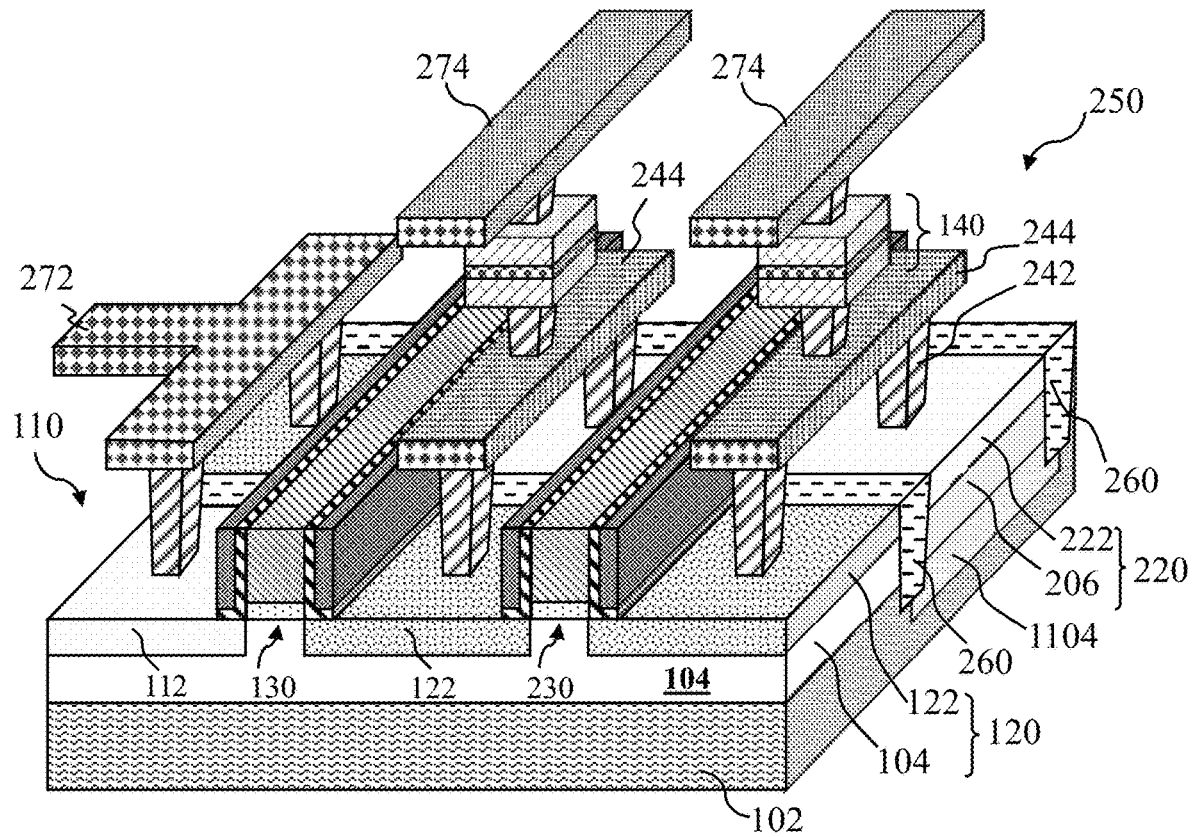

FIGS. 11A-11B illustrate processes in forming a memory array according to various non-limiting embodiments.

FIG. 11A shows a non-limiting embodiment alternative to the non-limiting embodiment of FIG. 10B. In the non-limiting alternative embodiment of FIG. 11A, forming the well 104 may include forming a deep well 1104 under the channel layer 206, wherein the deep well 1104 may have the same conductivity type with the well 104. In a non-limiting embodiment where the well 104 is a N-well, the deep well 1104 may be a deep N-well (DNW). The well 104 may include portions at the region where the diode 120 is to be formed and may include the deep well 1104 at the region where the further diode 220 is to be formed (as shown in FIG. 11B below), where the portions of the well 104 and the deep well 104 are separated via the isolation element 260. The isolation well 262 in the non-limiting embodiment of FIG. 10B may be absent in the non-limiting embodiment of FIG. 11A.

The processes of FIGS. 10C-10F may be similarly performed over the structure obtained in FIG. 11A, to form the memory array structure in FIG. 11B. The memory array formed in FIG. 11B may be a 2S1R memory array, similar to the memory array formed in FIG. 10F, but with the difference that the well 104 may include portions at the region of the diode 120 and may include the deep well 1104 at the region of the further diode 220. The deep well 1104 may be used for separating the channel layer 206 (e.g. P-type channel) which may serve as a bitline connected to the further diodes 220, from the well layer 104 (e.g. N-well) which may serve as a bitline connected to the diodes 120 in the 2S1R memory array of FIG. 11B.

FIGS. 12A-12F illustrate a method of forming a memory array according to various non-limiting embodiments. In the non-limiting embodiments of FIGS. 12A-12F, the method of forming the memory array 500 is illustrated. Various non-limiting embodiments described in context of the memory array 500 above and the method of FIG. 9 are analogously valid for the method of FIGS. 12A-12F, and vice versa. It is understood that the method of FIGS. 12A-12F may be similarly used to form the memory device 100 of FIG. 1 including a single memory cell of the memory array 500. Various non-limiting embodiments described in context of the memory device 100 above and the method of FIG. 8 are analogously valid for the method of FIGS. 12A-12F, and vice versa.

In FIG. 12A, a substrate 102 may be provided. The substrate 102 may include a silicon substrate, a SOI (silicon-on-insulator) substrate, a germanium substrate, or any other suitable types of semiconductor substrates. A plurality of isolation elements 260 may be formed in a column in the substrate 102. The isolation elements 260 may be formed as STI, and may be arranged in a column similar to FIG. 5.

In FIG. 12B, a well 104 having a first conductivity type may be formed in the substrate 102, e.g., by ion implantation. The well 104 may include one or more portions separated by the isolation elements.

In FIG. 12C, a dummy gate 130 and a further dummy gate 230 may be formed over the well 104. The dummy gate and the further dummy gate 230 may each include a gate dielectric layer 132 arranged over the well 104, a gate layer 134 arranged over the gate dielectric layer 132, and an insulating spacer 136 surrounding the gate dielectric layer 132 and the gate layer 134. The gate dielectric layer 132 may include a dielectric material, such as an oxide material, e.g., silicon oxide. The gate layer 134 may include poly-silicon, or metal, such as Al, TaN, or TiN. The insulating spacer 136 may be arranged over the well 104, and may include an insulating material, e.g., silicon oxide, silicon nitride, or a combination thereof. In a non-limiting embodiment, the insulating spacer 136 may include an inner spacer 137 and an outer spacer 138 at least partially surrounding the inner spacer 137. In a non-limiting example, the inner spacer 137 may include silicon oxide, and the outer spacer 138 may include silicon nitride.

The isolation elements 260 may extend in a first direction, while the dummy gate 130 and the further dummy gate 230 may extend in a second direction perpendicular to the first direction. In other words, the dummy gate 130 and the further dummy gate 230 may intersect with the isolation elements 260, but may not be on the same level of surface as shown in FIG. 12C. In this manner, the isolation elements 260 may be configured to isolate memory cells arranged along the second direction, while the dummy gate 130 and the further dummy gate 230 may be configured to isolate the memory cells arranged along the first direction.

In FIG. 12D, a plurality of contact elements 110 and a plurality of diodes 120 may be formed. The forming of the contact elements 110 may include forming a plurality of first contacts 112 in the well 104. The forming of the diodes 120 may include forming a plurality of diode layers 122 in the well 104. The first contacts 112 and the diode layers 122 may be formed as doped regions in the well 102, e.g. by implantation. The first contact 112 may have the first conductivity type, and the diode layers 122 may have the second conductivity type. In a non-limiting embodiment where the well 102 is N-well, the first contacts 112 may be formed as n+ contacts, and the diode layers 122 may be formed as p+ diode layers.

As shown in FIG. 12D, the respective first contacts 112 may be spaced apart from the respective diode layers 122, such that the dummy gate 130 may be arranged over a space between the first contacts 112 and the diode layers 122. The further dummy gate 230 may be arranged over a space between the diode layers 122 from neighbouring columns.

In FIG. 12E, interconnects 242 may be formed over the first contacts 112, and metal layers may be formed further over the interconnects 242 for functioning as first signal lines 272, e.g. bitlines or wordlines. Interconnects 242 may also be formed over the diode layers 122, and metals layers 244 may be further formed over the interconnects 242 for electrical connection to memory elements as illustrated in FIG. 12F below.

In FIG. 12F, a plurality of memory elements 140 may be arranged or formed over the respective diode layer 122, and may be electrically connected to the respective diode layer 122 through one or more interconnects. Each memory element 140 and the respective diode 120 are electrically connected in series and form a respective memory cell 250 as illustrated in FIG. 5. Metal layers 274 may be formed on the respective memory elements 140, which may function as second signal lines 274, e.g., wordlines or bitlines. Accordingly, the structure formed in FIG. 12F may be a 1S1R memory array, similar to the memory array 500 described in FIG. 5 above.

By applying the predetermined voltages to the selected first signal line 272 and the selected second signal line 274, the corresponding diode 120 may be configured to select the memory element 140 for unipolar operation of the memory element 140 as described with reference to FIG. 6 and FIG. 7 above.

Additional interlayer dielectric (not shown in FIG. 12F) may be formed to isolate the memory elements 140 from each other, and to isolate the interconnects 242, the metals layer 244 and the signal lines 272, 274 from each other. Conventional BEOL processes may be further carried out for fabrication of further interconnects and metal layers.

According to various non-limiting embodiments above, the memory device 100 and the memory arrays 200, 500 may be provided, which employ CMOS compatible selectors/diodes for smaller area. The diodes, as selectors for the respective memory element, may be formed in source/drain regions of a transistor by implantation, e.g. in the FEOL (front end of line) process. These CMOS compatible diode selectors are compact and are not constrained by thermal budget, and achieve advantages of high on/off ratio, excellent endurance and capabilities of withstanding >400° C. thermal budget. Further, these diodes may be combined or arranged in a simple manner to achieve unipolar or bipolar operation of the memory elements. The simple and compact CMOS compatible diode may be configured in a cross-bar architecture to provide a high density 1S1R (one-selector and one-resistor) cross-point memory array 500 and a high density 2S1R (two-selector and one-resistor) cross-point memory array 200, for unipolar and bipolar operation with resistive memories.

In addition, the dummy gate 130 and the further dummy gate 230 may be formed as the gate region of the transistor, and provide compact isolation structures in the memory device 100 and the memory arrays 200, 500. By utilizing the dummy gate 130 and the further dummy gate 230 for isolation in the memory device 100 and the memory arrays 200, 500, a smaller cell size may be achieved, as compared to the conventional 1T1R memory structure. The conventional CMOS technology may be used for the memory device 100 and the memory arrays 200, 500 without requiring additional masks.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
   a substrate, wherein the substrate comprises a well having a first conductivity type;
   a contact element arranged in the well, wherein the contact element comprises a first contact having the first conductivity type;
   a diode layer arranged in the well, wherein the diode layer has a second conductivity type opposite to the first conductivity type;
   a dummy gate configured to isolate the first contact from the diode layer; and
   a memory element electrically connected to the diode layer.

2. The memory device of claim 1, wherein the diode layer and at least a portion of the well form a diode.

3. The memory device of claim 1, further comprising:
   a channel layer having the second conductivity type, wherein the channel layer is arranged in the well; and
   a further diode layer arranged in the channel layer, wherein the further diode layer has the first conductivity type and is electrically connected to the memory element, wherein the further diode layer and at least a portion of the channel layer form a further diode.

4. The memory device of claim 3, further comprising an isolation element arranged in the substrate and an isolation well under the isolation element,
   wherein the isolation element is arranged between the diode layer and the further diode layer, and
   wherein the isolation well has the second conductivity type.

5. The memory device of claim 3, wherein the contact element further comprises:
   a second contact arranged in the channel layer where the second contact has the second conductivity type; and
   a third contact arranged in the well where the third contact has the first conductivity type.

6. The memory device of claim 5, wherein the dummy gate is configured to isolate the second contact from the further diode layer.

7. The memory device of claim 1, wherein the dummy gate comprises a gate dielectric layer, a gate layer arranged over the gate dielectric layer, and an insulating spacer surrounding the gate dielectric layer and the gate layer.

8. The memory device of claim 1, wherein the contact element is electrically connected to a first signal line, and wherein the memory element is electrically connected to a second signal line.

9. The memory device of claim 1, wherein the memory element is a resistive memory.

10. A method of forming a memory device, the method comprising:
    providing a substrate, wherein the substrate comprises a well having a first conductivity type;
    forming a contact element in the well, wherein the contact element comprises a first contact having the first conductivity type;
    forming a diode layer in the well, wherein the diode layer has a second conductivity type opposite to the first conductivity type;
    forming a dummy gate to isolate the first contact from the diode layer; and
    electrically connecting a memory element to the diode layer.

11. The method of claim 10, further comprising:
    forming a channel layer in the well, wherein the channel layer has the second conductivity type;
    forming a further diode layer in the channel layer and electrically connecting the further diode layer to the memory element, wherein the further diode layer has the first conductivity type.

12. A memory array comprising:
    a substrate, wherein the substrate comprises a well having a first conductivity type;
    a plurality of columns comprising a plurality of memory cells arranged in a matrix form, wherein the plurality of columns comprises a first column of memory cells and a second column of memory cells; wherein each memory cell comprises:
       a diode layer arranged in the well, wherein the diode layer has a second conductivity type opposite to the first conductivity type; and
       a memory element electrically connected to the diode layer;
    a contact element column comprising contact elements arranged in the well, wherein each contact element comprises a first contact having the first conductivity type;
    a dummy gate configured to isolate the contact element column from the diode layer of each memory cell in the first column of memory cells; and
    a further dummy gate configured to isolate the diode layers in the first column of memory cells from the diode layers in the second column of memory cells.

13. The memory array of claim 12, further comprising a plurality of isolation elements arranged in a column in the substrate, wherein the isolation elements are configured to isolate the diode layers of the memory cells within a same column of memory cells.

14. The memory array of claim 12, wherein a respective diode layer and at least a portion of the well form a diode for each memory cell.

15. The memory array of claim 12, wherein each memory cell further comprises:
    a channel layer having the second conductivity type, wherein the channel layer is arranged in the well,
    a further diode layer arranged in the channel layer, wherein the further diode layer has the first conductivity type and is electrically connected to the respective memory element, wherein the further diode layer and at least a portion of the channel layer form a further diode.

16. The memory array of claim 15, further comprising a plurality of isolation elements arranged in a column in the substrate and a respective isolation well under the respective isolation element,
    wherein the respective isolation element is arranged between the diode layer and the further diode layer in each column of memory cells, wherein the isolation wells have the second conductivity type.

17. The memory array of claim 15, wherein the contact element column further comprises:
a plurality of second contacts arranged in the channel layers where the plurality of second contacts have the second conductivity type; and
a plurality of third contacts arranged in the well where the plurality of third contacts have the first conductivity type.

18. The memory array of claim 17,
wherein the dummy gate is configured to isolate the plurality of second contacts in the contact element column from the further diode layers in the first column of memory cells;
wherein the further dummy gate is configured to isolate the further diode layers in the first column of memory cells from the further diode layers in the second column of memory cells.

19. The memory array of claim 12, wherein each of the dummy gate and the further dummy gates comprises a gate dielectric layer, a gate layer arranged over the gate dielectric layer, and an insulating spacer surrounding the gate dielectric layer and the gate layer.

20. The memory array of claim 12, wherein each contact element is electrically connected to a respective first signal line, and wherein each column of memory elements is electrically connected to a respective second signal line.

* * * * *